US009721761B2

(12) United States Patent
Wilson et al.

(10) Patent No.: US 9,721,761 B2
(45) Date of Patent: *Aug. 1, 2017

(54) OPEN PLASMA LAMP FOR FORMING A LIGHT-SUSTAINED PLASMA

(71) Applicant: KLA-Tencor Corporation, Milpitas, CA (US)

(72) Inventors: Lauren Wilson, San Jose, CA (US); Anant Chimmalgi, San Jose, CA (US); Ilya Bezel, Sunnyvale, CA (US); Anatoly Shchemelinin, Pleasanton, CA (US); Matthew Derstine, Los Gatos, CA (US); Gildardo Delgado, Livermore, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/043,804

(22) Filed: Feb. 15, 2016

(65) Prior Publication Data
US 2016/0163516 A1    Jun. 9, 2016

Related U.S. Application Data

(63) Continuation of application No. 14/670,210, filed on Mar. 26, 2015, now Pat. No. 9,263,238.
(Continued)

(51) Int. Cl.
*H01J 37/00* (2006.01)
*H01J 37/32* (2006.01)
*H01J 65/04* (2006.01)

(52) U.S. Cl.
CPC .. *H01J 37/32339* (2013.01); *H01J 37/32449* (2013.01); *H01J 65/04* (2013.01)

(58) Field of Classification Search
CPC ...................... H01J 37/32339; H01J 37/32449
(Continued)

(56) References Cited

U.S. PATENT DOCUMENTS 7,435,982 B2    10/2008  Smith
7,786,455 B2    8/2010   Smith
(Continued)

OTHER PUBLICATIONS

International Search Report for Application No. PCT/US2015/023177 dated Jun. 25, 2015, 3 pages.
(Continued)

*Primary Examiner* — Michael Maskell
(74) *Attorney, Agent, or Firm* — Suiter Swantz pc llo

(57) ABSTRACT

An open plasma lamp includes a cavity section. A gas input and gas output of the cavity section are arranged to flow gas through the cavity section. The plasma lamp also includes a gas supply assembly fluidically coupled to the gas input of the cavity section and configured to supply gas to an internal volume of the cavity section. The plasma lamp also includes a nozzle assembly fluidically coupled to the gas output of the cavity section. The nozzle assembly and cavity section are arranged such that a volume of the gas receives pumping illumination from a pump source, where a sustained plasma emits broadband radiation. The nozzle assembly is configured to establish a convective gas flow from within the cavity section to a region external to the cavity section such that a portion of the sustained plasma is removed from the cavity section by the gas flow.

70 Claims, 18 Drawing Sheets

Related U.S. Application Data

(60) Provisional application No. 61/971,035, filed on Mar. 27, 2014.

(58) Field of Classification Search
USPC .............. 250/504 R; 315/111.01, 111.21; 313/231.01, 231.31
See application file for complete search history.

(56) References Cited

U.S. PATENT DOCUMENTS

| | | | |
|---|---|---|---|
| 7,989,786 B2 | 8/2011 | Smith et al. | |
| 8,182,127 B2 | 5/2012 | Yasuda et al. | |
| 8,216,773 B1 | 7/2012 | Delgado | |
| 9,099,292 B1 | 8/2015 | Bezel | |
| 9,185,788 B2 | 11/2015 | Bezel et al. | |
| 2007/0228288 A1 | 10/2007 | Smith | |
| 2007/0228300 A1 | 10/2007 | Smith | |
| 2011/0127450 A1 | 6/2011 | Holber et al. | |
| 2011/0181191 A1 | 7/2011 | Smith et al. | |
| 2011/0204265 A1 | 8/2011 | Smith et al. | |
| 2013/0003384 A1 | 1/2013 | Bezel et al. | |
| 2013/0106275 A1 | 5/2013 | Chimmalgi et al. | |
| 2013/0181595 A1 | 7/2013 | Bezel | |
| 2013/0233836 A1 | 9/2013 | Dackson | |
| 2013/0342105 A1* | 12/2013 | Shchemelinin | H01J 37/32055 315/111.21 |
| 2014/0060792 A1 | 3/2014 | Bezel | |
| 2014/0291546 A1* | 10/2014 | Bezel | H01J 65/00 250/432 R |
| 2015/0034838 A1 | 2/2015 | Bezel | |
| 2015/0201483 A1 | 7/2015 | Bezel | |

OTHER PUBLICATIONS

A. Schreiber et al., Radiation resistance of quartz glass for VUV discharge lamps, Journal of Physics D: Applied Physics, Aug. 19, 2005, p. 3242-3250, vol. 38, IOP Publishing Ltd, Printed in the UK.

* cited by examiner

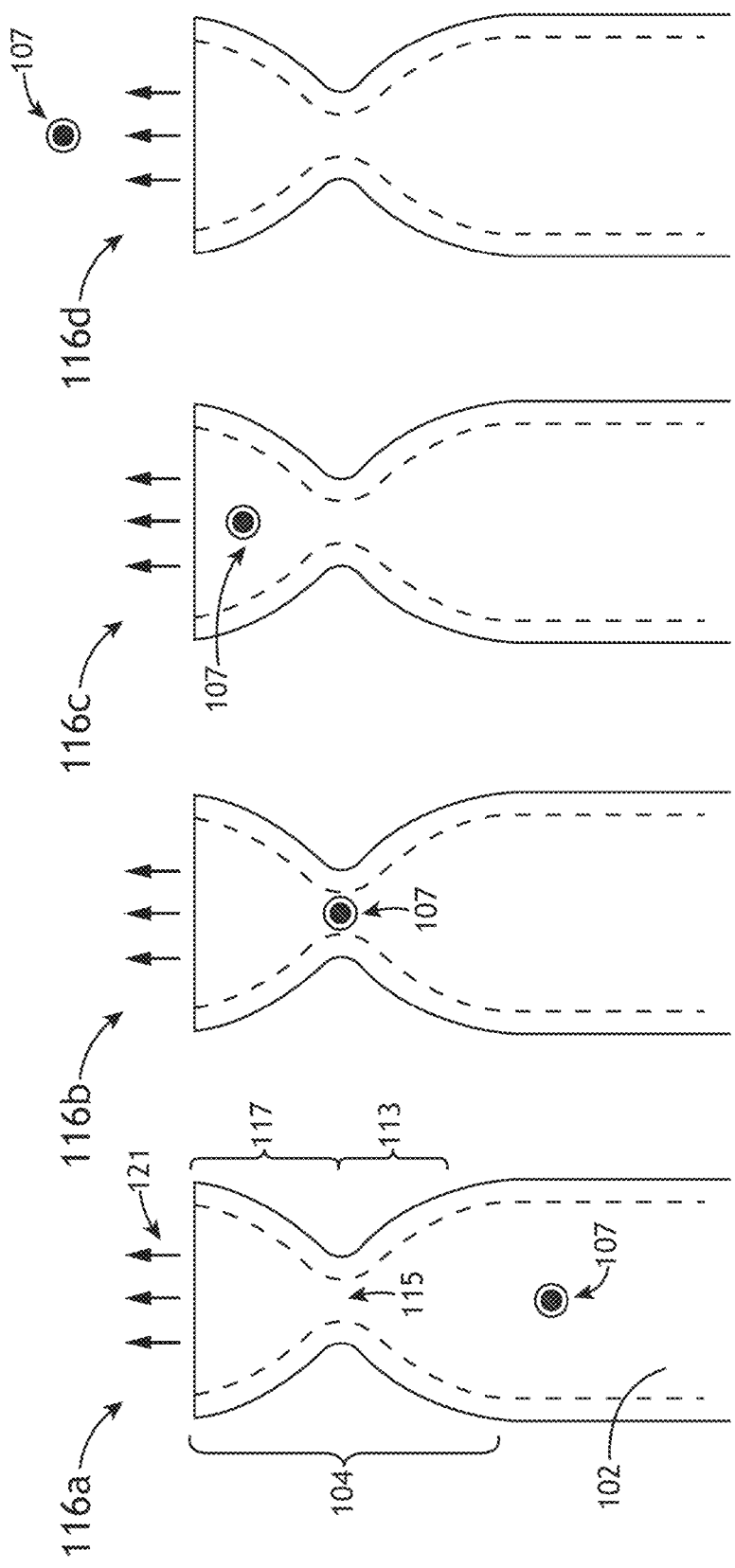

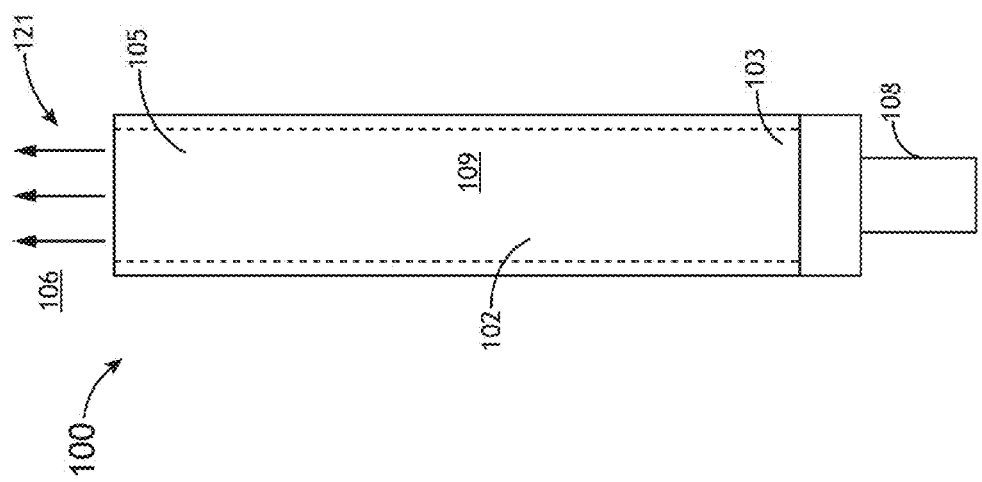
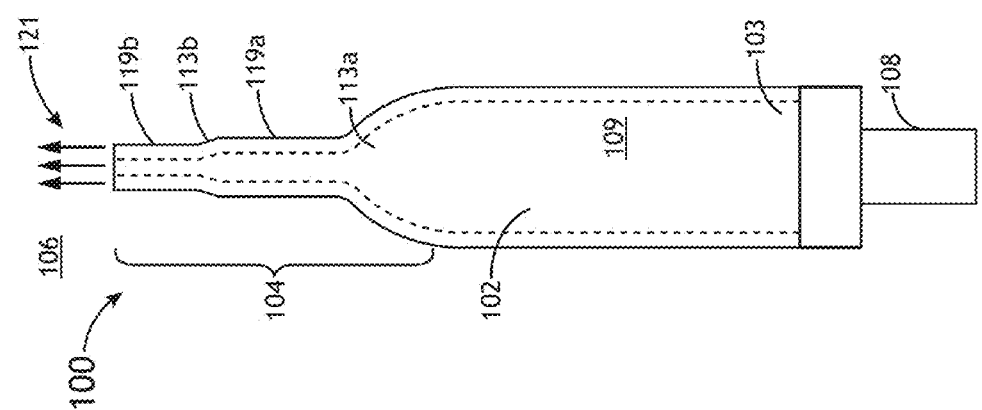

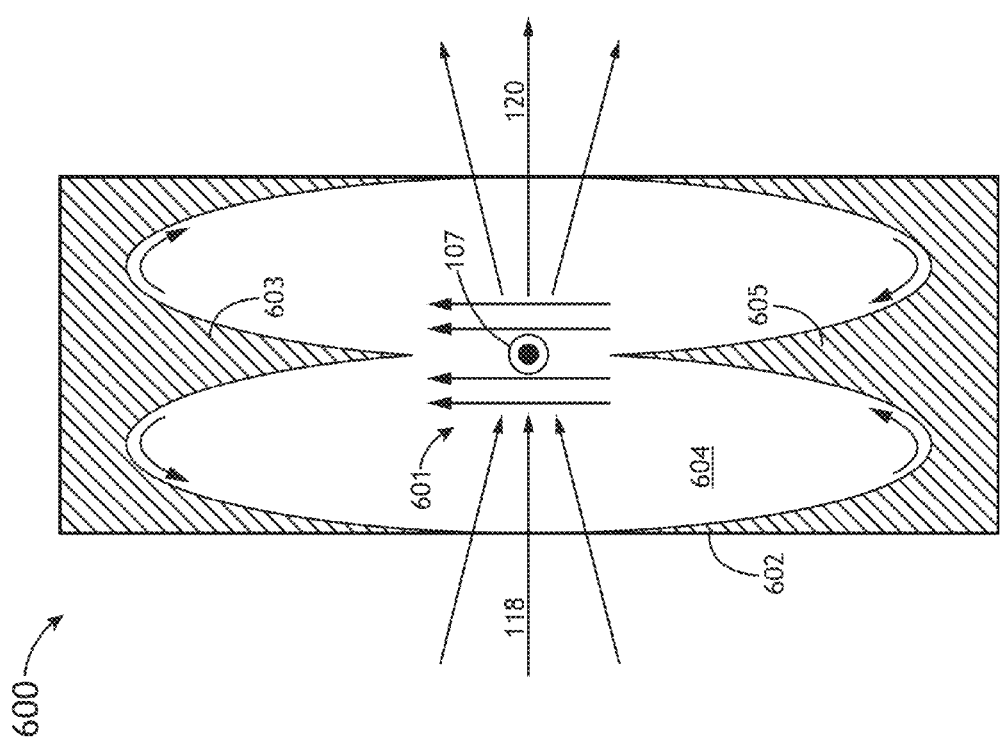

OPEN PLASMA LAMP FOR FORMING A LIGHT-SUSTAINED PLASMA

CROSS-REFERENCE TO RELATED APPLICATION

The present application claims the benefit and is a continuation application of U.S. Non-Provisional patent application Ser. No. 14/670,210, filed on Mar. 26, 2015, entitled OPEN PLASMA LAMP FOR FORMING A LIGHT-SUSTAINED PLASMA, naming Lauren Wilson, Anant Chimmalgi, Ilya Bezel, Anatoly Shchemelinin, Matthew Derstine and Gildardo Delgado as inventors, which is a non-provisional application of U.S. Provisional Patent Application Ser. No. 61/971,035, filed on Mar. 27, 2014, entitled FORCED CONVECTION CONTROL OF LASER SUSTAINED PLASMAS, naming Lauren Wilson and Anant Chimmalgi as inventors. Application Ser. Nos. 14/670,210 and 61/971,035 are both incorporated herein by reference in the entirety.

TECHNICAL FIELD

The present disclosure generally relates to light-sustained plasma light sources light, and, more particularly, to convection control in a light-sustained plasma lamp.

BACKGROUND

As the demand for integrated circuits having ever-small device features continues to increase, the need for improved illumination sources used for inspection of these ever-shrinking devices continues to grow. One such illumination source includes a laser-sustained plasma source. Laser-sustained plasma light sources are capable of producing high-power broadband light. Laser-sustained light sources operate by focusing laser radiation into a gas volume in order to excite the gas, such as argon or xenon, into a plasma state, which is capable of emitting light. This effect is typically referred to as plasma "pumping." Laser-sustained plasma light sources typically operate by focusing laser light into a sealed lamp containing a selected working gas. These approaches typically rely on natural convection to cool the plasma. Natural convection is often insufficient for optimizing a given plasma source and may cause the plasma to grow outside of the optimal collection region, resulting in a larger and dimmer plasma. Therefore, it would be desirable to provide an apparatus, system and/or method for curing defects such as those identified above.

SUMMARY

An open plasma lamp for forming a light-sustained plasma is disclosed, in accordance with an illustrative embodiment of the present invention. In one illustrative embodiment, the plasma lamp includes a cavity section including a gas input and a gas output, the gas input and the gas output arranged to flow gas through the cavity section. In another illustrative embodiment, the plasma lamp includes a gas supply assembly fluidically coupled to the gas input of the cavity section and configured to supply gas to an internal volume of the cavity section. In another illustrative embodiment, the plasma lamp includes a nozzle assembly fluidically coupled to the gas output of the cavity section. In one illustrative embodiment, the nozzle assembly and cavity section are arranged such that a volume of the gas receives pumping illumination from a pump source to sustain a plasma within the gas, wherein the sustained plasma emits broadband radiation. In another illustrative embodiment, the nozzle assembly is configured to establish a convective gas flow from within the cavity section to a region external to the cavity section such that a portion of the sustained plasma is removed from the cavity section by the gas flow.

A system for forming a light-sustained plasma is disclosed, in accordance with an illustrative embodiment of the present invention. In one illustrative embodiment, the system includes a pump source configured to generate pumping illumination. In another illustrative embodiment, the system includes an open plasma lamp. In another illustrative embodiment, the open plasma lamp includes: a cavity section including a gas input and a gas output, the gas input and the gas output arranged to flow gas through the cavity section; a gas supply assembly fluidically coupled to the gas input of the cavity section and configured to supply gas to an internal volume of the cavity section; and a nozzle assembly fluidically coupled to the gas output of the cavity section, wherein the nozzle assembly is configured to establish a gas flow from within the cavity section to a region external to the cavity section such that a portion of the sustained plasma is removed from the cavity section by the gas flow. In another illustrative embodiment, the system includes a collector element arranged to focus the illumination from the pump source into the gas in order to sustain a plasma within the gas. In another illustrative embodiment, the plasma emits broadband radiation.

A plasma lamp for forming a light-sustained plasma is disclosed, in accordance with an illustrative embodiment of the present disclosure. In one illustrative embodiment, the plasma lamp includes a gas containment structure configured to contain a gas suitable for generating a plasma upon absorption of pump illumination from a pump source. In another illustrative embodiment, the plasma lamp includes a convection control element disposed within the gas containment structure, wherein the convection control element includes a channel for directing a plume of the plasma along a selected direction, wherein the convection control element is thermally coupled to a thermal reservoir and configured to transfer heat from the plume of the plasma to the thermal reservoir.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIGS. 1C-1F are schematic views of an open plasma lamp depicting various positions of plasma generation, in accordance with one embodiment of the present disclosure.

FIGS. 1G-1J are schematic views of various shapes of an open plasma lamp, in accordance with one embodiment of the present disclosure.

FIGS. 6A-6B are schematic views of plasma lamps equipped with convection control elements, in accordance with one embodiment of the present disclosure.

DETAILED DESCRIPTION OF THE INVENTION

Reference will now be made in detail to the subject matter disclosed, which is illustrated in the accompanying drawings.

Referring generally to FIGS. 1A through 3B, a plasma lamp for generating a light-sustained plasma is described in accordance with one or more embodiments of the present disclosure. Embodiments of the present disclosure are directed to the generation of broadband light with a light-sustained plasma light source with an open-ended plasma lamp. Additional embodiments of the present disclosure are directed to an open-ended plasma lamp equipped with a nozzle assembly sufficient to actively control the convective flow of gas around the plasma of the given plasma lamp. For example, embodiments of the present disclosure provide for the active adjustment of pressure and mass flow rate of gas supplied to the open-ended plasma lamp. In addition, embodiments of the present disclosure provide for removal of cooler outside regions or layers of the plasma. The removal of cooler outside regions of the plasma allows more pump light to reach a core region of the plasma, which, in turn, results in a more efficient production of broadband radiation. It is further noted that actively controlling gas/plasma convection provides for greater control over plasma dynamics. Improved control over plasma dynamics may allow an increase in brightness of the plasma without an increase of pump light power.

The generation of plasma within inert gas species is generally described in U.S. patent application Ser. No. 11/695,348, filed on Apr. 2, 2007; and U.S. patent application Ser. No. 11/395,523, filed on Mar. 31, 2006, which are incorporated herein in their entirety. Various plasma cell designs and plasma control mechanisms are described in U.S. patent application Ser. No. 13/647,680, filed on Oct. 9, 2012, which is incorporated herein by reference in the entirety. The generation of plasma is also generally described in U.S. patent application Ser. No. 14/224,945, filed on Mar. 25, 2014; and U.S. patent application Ser. No. 12/787,827, filed on May 26, 2010, which are incorporated by reference herein in the entirety. Plasma cell and control mechanisms are also described in U.S. patent application Ser. No. 14/231,196, filed on Mar. 31, 2014; and U.S. patent application Ser. No. 14/567,546, filed Dec. 11, 2014, which are incorporated by reference herein in the entirety. Plasma cell and control mechanisms are also described in U.S. patent application Ser. No. 14/288,092, filed on May 27, 2014, which is incorporated by reference herein in the entirety. Plasma cell and control mechanisms are also described in U.S. patent application Ser. No. 13/741,566, filed on Jan. 15, 2013, which is incorporated by reference herein in the entirety.

Figure 1A:
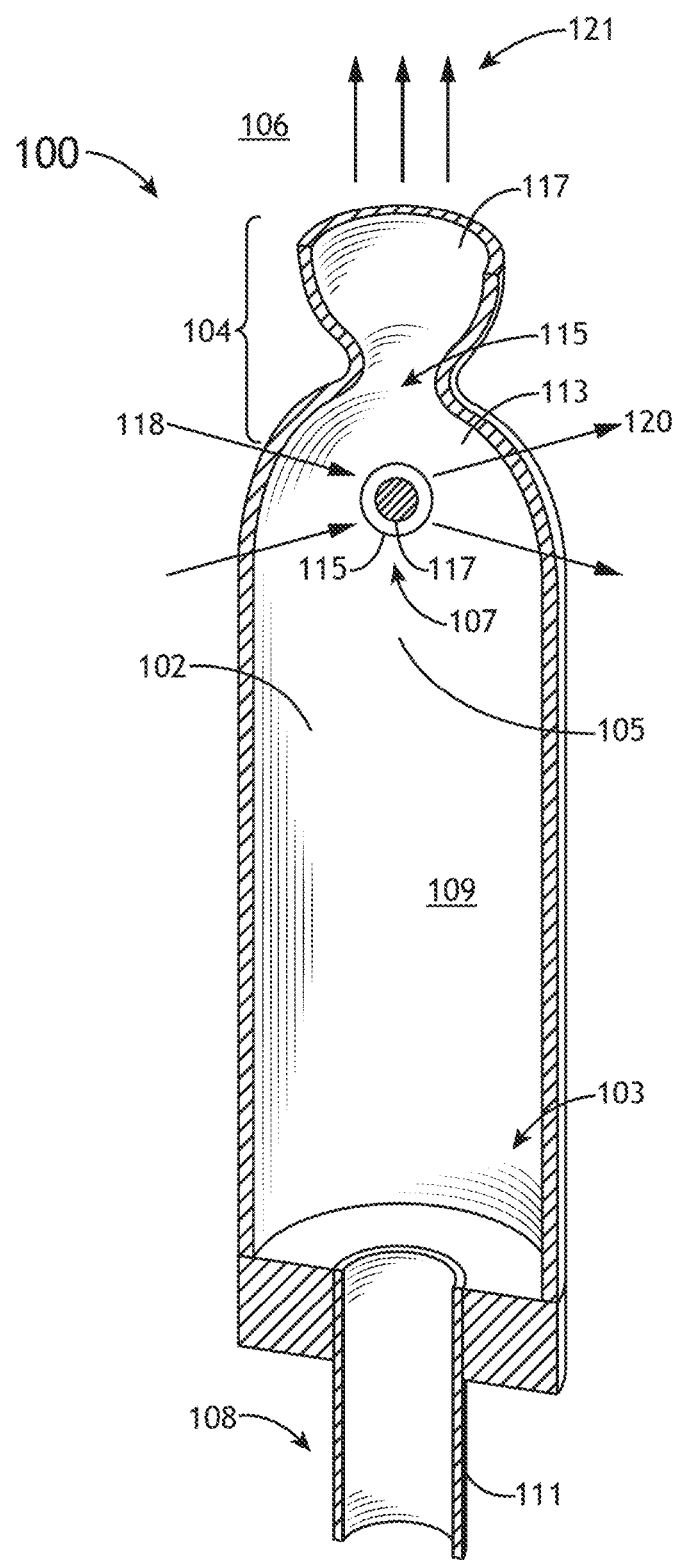
FIG. 1A is a schematic view of an open plasma lamp, in accordance with one embodiment of the present disclosure.
Figure 1B:
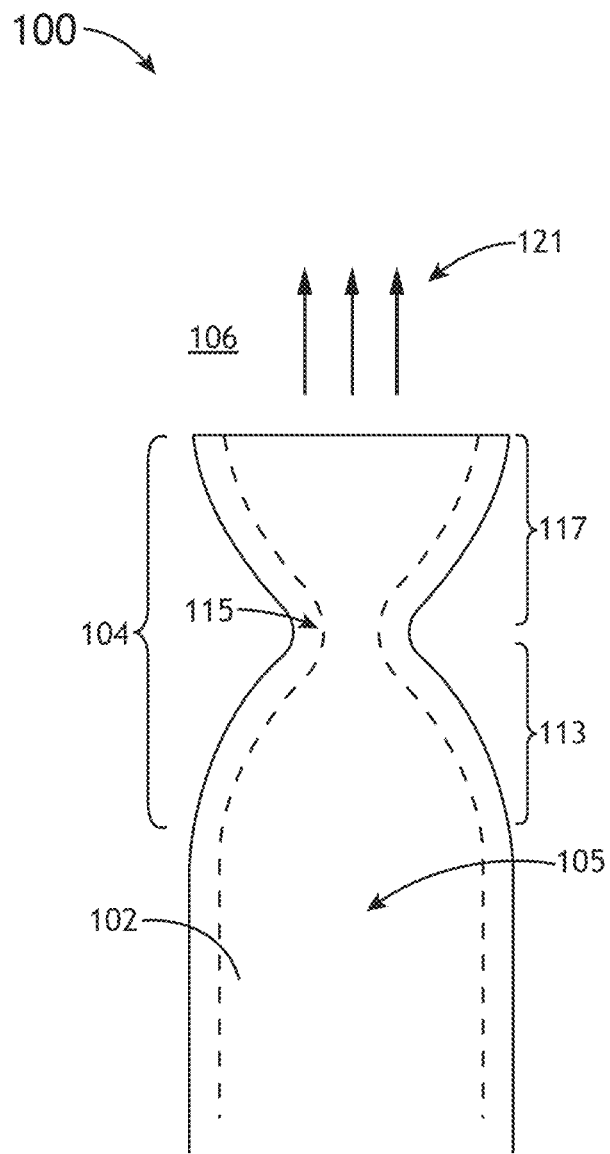
FIG. 1B is a schematic view of an open plasma lamp, in accordance with one embodiment of the present disclosure.

FIGS. 1A-1B illustrate a plasma lamp 100 for forming a light-sustained plasma, in accordance with one or more embodiment of the present disclosure. In one embodiment, the plasma lamp 100 includes a cavity section 102 having a gas input 103 and a gas output 105. In another embodiment, the plasma lamp 100 includes a gas supply assembly 108 fluidically coupled to the gas input 103 of the cavity section 102 and configured to supply gas to an internal volume of the cavity section 102. For example, the gas supply assembly 108 may include, but is not limited to, a gas supply (not shown in FIG. 1A), such as, but not limited to, a supply tank (e.g., see FIG. 2) or a recirculation sub-system (see FIGS. 3A-3B) configured to deliver gas to the internal volume of the cavity section 102 via a gas port 111.

In another embodiment, the gas input 103 and the gas output 105 are arranged to flow gas 109 through the cavity section 102. For example, the gas input 103 and the gas output 105 are fluidically coupled so that the gas 109 from the gas port 111 enters the cavity 102 through the gas input 103, flows through the length of cavity section 102 and exits the cavity section 102 via gas output 105.

In another embodiment, the plasma lamp 100 includes a nozzle assembly 104. In one embodiment, the nozzle assembly 104 is fluidically coupled to the gas output 105 of the cavity section 102. In this regard, the nozzle assembly 104 may serve to transfer gas 109 from within the cavity section 102 to a region 106 external to the cavity section 102.

In one embodiment, the nozzle assembly 104 includes, but is not required to include, a converging section 113. In one embodiment, the nozzle assembly 104 includes, but is not required to include, a diverging section 117. In one embodiment, as shown in FIGS. 1A and 1B, the nozzle assembly 104 is a converging-diverging nozzle assembly including both a converging section 113 and a diverging section 117. For example, the nozzle assembly 104 may include, but is not limited to, a de Laval nozzle assembly.

In one embodiment, the nozzle assembly 104 includes a constricting section 115, or throat section. For example, the constricting section 115 of nozzle assembly 104 may be located between, or form a transition between, the converging section 113 and the diverging section 117 of the nozzle assembly 104. In this regard, gas 109 may flow from the cavity section 102 into the converging section 113 of the nozzle assembly 104. After the gas flows through the converging section 113 it may enter the constricting section 115. In turn, gas may exit the constricting section 115 and enter the diverging section 117 and ultimately be exhausted into a region 106 external to the plasma cell 100.

The nozzle assembly 104 may establish a gas flow 121 from the cavity section 102 to a region 106 external to the plasma lamp (e.g., external to the cavity section 102 and nozzle assembly 104) such that a portion of the light-sustained plasma 107 is removed from the cavity section 102 by the gas flow 121. For example, the established gas flow 121 may be sufficient to remove an outside portion of the plasma 107 and exhaust the gas to a region 106 outside of the plasma lamp 100. In this regard, the size and shape of the nozzle assembly 104 (and the sections 113, 115, 117 of the nozzle assembly 104) may be selected such that the nozzle assembly 104 establishes a sufficient gas flow rate at or near the outside edge of the plasma 107 such that a portion of the plasma 107 is removed. For instance, the nozzle assembly 104 may establish a gas flow rate sufficient to remove a portion of the outer region 115 of plasma 107. As previously noted, the outer regions 115 of the plasma 107 may at least partially shield the core 117 of the plasma 107 from pumping illumination 118. In this setting, the outer regions 115 of the plasma 107 behave as shield layers. The removal of at least a portion of these shielding layers 115 may serve to more readily expose the core 117 of the plasma 107 to pumping illumination 118. The improved exposure of the core 117 to pumping illumination 118 results in more efficient production of broadband radiation 120 and a brighter broadband radiation output.

In another embodiment, one or more fluid characteristics of the gas 109 of plasma lamp 100 are adjustable. For example, the pressure of gas 109 and/or the mass flow rate of the flow of gas 109 may be, but are not required to be, selectively adjusted. For instance, the gas pressure and/or mass flow rate of the gas 109 may be adjusted based on the power of the pump illumination 118. In one embodiment, the pressure and/or mass flow rate of the gas 109 may be adjusted using the gas supply assembly 108. In this regard, pressure and/or mass flow rate may be actively controlled by increasing or decreasing the supply of gas 108 to the cavity section 102.

In one embodiment, the gas flow of the plasma lamp 100 is controlled so as to establish a laminar gas flow 121. For example, the nozzle assembly 104 and the sections of the nozzle assembly 104 may be structured such that the gas supply assembly 108 can establish a laminar gas flow 121.

In another embodiment, the gas flow of the plasma lamp 100 is controlled so as to establish a super-sonic gas flow 121. For example, the nozzle assembly 104 and the sections of the nozzle assembly 104 may be structured such that the gas supply assembly 108 can establish a super-sonic gas flow 121 through one or more portions of the plasma lamp 100. In another embodiment, the gas flow of the plasma lamp 100 is controlled so as to establish a sub-sonic gas flow 121. For example, the nozzle assembly 104 and the sections of the nozzle assembly 104 may be structured such that the gas supply assembly can establish a sub-sonic gas flow 121 through one or more portions of the plasma lamp 100.

It is noted herein that plasma lamp 100 of the present disclosure may sustain plasma 107 at various locations within and outside of the plasma lamp 100. FIGS. 1C-1F illustrate various locations with which plasma 107 may be sustained by plasma lamp 100. In one embodiment, as shown in FIG. 1C, plasma 107 is sustained within the internal volume of the cavity section 102. In another embodiment, although not shown, plasma 107 is sustained within the converging section 117 of nozzle assembly 104. In another embodiment, as shown in FIG. 1D, plasma 107 is sustained within the constricting section 115, or the throat, of nozzle assembly 104. In another embodiment, as shown in FIG. 1E, plasma 107 is sustained within the diverging section 117 of nozzle assembly 104. In another embodiment, as shown in FIG. 1F, plasma 107 is sustained at a position above the diverging section 117 of nozzle assembly 104 and outside the plasma lamp 100. It is noted herein that with sufficient gas flow through the plasma lamp 100 the plasma 107 may be maintained within the flow 121 at a position above the diverging section 117 (or other output portion of nozzle assembly 104).

The shape of the nozzle assembly 104 and the sections of the nozzle assembly 104 may take on any shape or combination of shapes known in the art of gas nozzles. For example, the nozzle assembly 104 and/or the sections of the nozzle assembly 104 may be constructed with any one of the following shapes (or a portion or a combination of the following shapes) including, but not limited to, a cylinder, a tube, a prolate spheroid, an ellipsoid, a spheroid and the like.

It is also noted herein that the shape of the cavity section 102 and the sections of the cavity section 102 may take on any shape, a portion of a shape or combination of shapes known in the art of gas nozzles. For example, the cavity section 104 may be constructed with any one of the following shapes (or a portion or a combination of the following shapes) including, but not limited to, a cylinder, a tube, a prolate spheroid, an ellipsoid, a spheroid and the like.

By way of example, as shown in FIGS. 1A-1B, the cavity section 104 of plasma lamp 100 may have, but is not limited to, a cylindrical shape. Further, the converging section 113 of the nozzle assembly 104 may have, but is not limited to, a truncated prolate spheroid shape. In addition, the diverging section 117 of the nozzle assembly 104 may have, but is not limited to, a truncated prolate spheroid shape. As shown in FIGS. 1A-1B, the output portion of the converging section 113 can form, or be integrated with, the entrance portion of diverging section 117 such that the nozzle assembly 104 forms an integrated converging-diverging nozzle assembly.

It is further noted the wall of cavity section 104 can form, or be integrated with, the entrance portion of the nozzle assembly 104, as shown in FIG. 1A. For example, as shown in FIGS. 1A and 1B, the output portion 105 of the cavity section 102 is integrated with the converging section 113 of the nozzle assembly 104 such that the nozzle assembly 104 and cavity section 102 form an integrated structure. For instance, an integrated cavity section/nozzle assembly structure may be formed from a single material, such as a material suitably transparent to pump illumination and emitted broadband radiation from plasma 107.

Figure 1H:
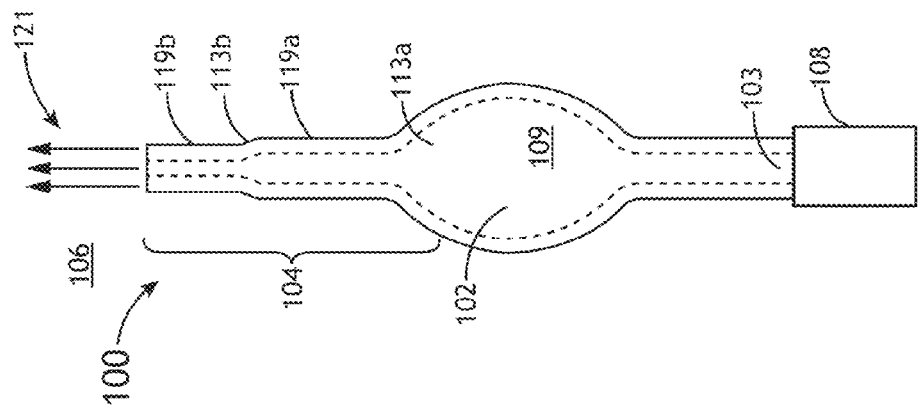
Figure 1G:
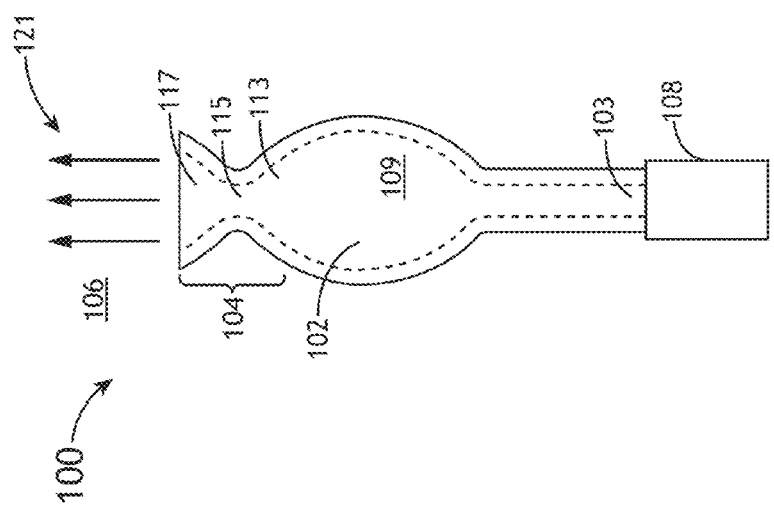

FIGS. 1G-1J illustrate additional shapes suitable for use in the plasma lamp 100, in accordance with one or more embodiments of the present disclosure. In one embodiment, as shown in FIG. 1G, the plasma lamp 100 may include a cavity section 102 having a prolate spheroid shape. In another embodiment, a top portion of the cavity section 102 may serve as a converging to for the nozzle assembly 104. Such a configuration is depicted, for example, in FIG. 1G. As shown, the top portion of the prolate spheroid shaped cavity section 102 also acts as a converging section 113 of the nozzle assembly. In another embodiment, the nozzle assembly 104 includes a diverging section 117.

In another embodiment, as shown in FIG. 1H, the nozzle assembly 104 may include multiple converging portions. For example, the nozzle assembly 104 may include a first converging section 113, which is integrated with the cavity section 102. In addition, the nozzle assembly 104 of FIG. 1H includes a first shaft section 119a. The first shaft section 119a is then coupled to a second converging section 113b, which further converges the gas flow 121 in the nozzle assembly 104. Further, the second converging section 11b may be coupled to a second shaft section 119, which then exhausts flow 121 at the opening of the plasma lamp 100.

In another embodiment, as shown in FIG. 1I, the dual converging configuration described with respect to FIG. 1H can be integrated with a cylinder-shaped cavity section 102.

It is again noted that any of the nozzle assembly 104 configurations of the present disclosure may be integrated with any of the cavity section 102 configurations of the present disclosure. Further, the various combinations are not limited those depicted in FIG. 1A and FIGS. 1G-1J and any combination of cavity sections, converging sections, diverging sections and/or shaft sections may be used in the plasma cell 100 of the present disclosure.

In another embodiment, as shown in FIG. 1J, the plasma lamp 100 may also be constructed without a nozzle assembly 104. In this embodiment, the cavity section 102 acts to provide the necessary flow control to achieve the desired flow 121.

Figure 1K:
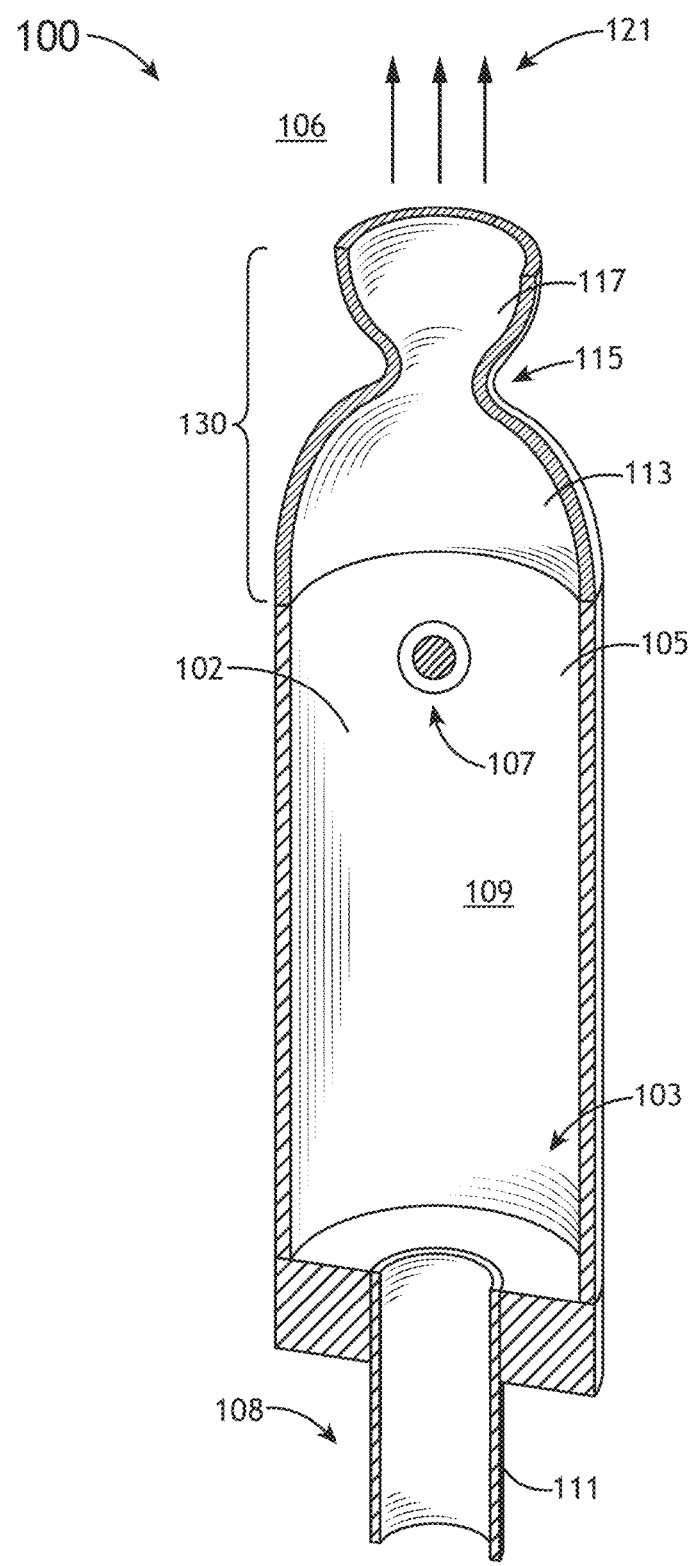
FIG. 1K is a schematic view of an open plasma lamp with a detachable nozzle assembly, in accordance with one embodiment of the present disclosure.

FIG. 1K illustrates plasma lamp 100 equipped with a detachable nozzle assembly 130, in accordance with one or more embodiments of the present disclosure. In this regard, the nozzle assembly 130 is reversibly mechanically couplable to the output portion of the cavity section 102. It is noted herein that any cavity section 102 may be adapted for use as an open-ended plasma lamp 100 with the attachment of the removable nozzle assembly 130. In one embodiment, the detachable nozzle assembly 130 may be constructed of the same material as the cavity section 102. In another embodiment, the detachable nozzle assembly 130 and the cavity section 102 may be constructed of different materials. For example, the nozzle assembly 130 may be constructed of a metal or ceramic material, with the cavity section 102 being constructed of a material transparent to the pump illumination and broadband radiation in question. Various suitably transparent materials are described further herein. It is further noted that the detachable nozzle assembly 130 may take the form of any nozzle assembly configuration described throughout the present disclosure.

Referring again to FIG. 1A, in one embodiment, the plasma lamp 100 may utilize any selected gas (e.g., argon, xenon, mercury or the like) known in the art suitable for generating plasma upon absorption of suitable illumination. In one embodiment, focusing illumination 118 from a pump source (e.g., see pump source 202 in FIG. 2) into the volume of gas 109 causes energy to be absorbed through one or more selected absorption lines of the gas or plasma within the cavity section 102, within the nozzle assembly 104 and/or above the nozzle assembly 104. This absorption of energy causes "pumping" of the gas species in order to generate or sustain the plasma 107.

The plasma lamp 100 of the present disclosure may be utilized to initiate and/or sustain a plasma 107 in a variety of gas environments. In one embodiment, the gas used to initiate and/or maintain plasma 107 may include an inert gas (e.g., noble gas or non-noble gas) or a non-inert gas (e.g., mercury). In another embodiment, the gas used to initiate and/or maintain a plasma 107 may include a mixture of gases (e.g., mixture of inert gases, mixture of inert gas with non-inert gas or a mixture of non-inert gases). For example, the volume of gas 109 used to generate a plasma 107 may include, but is not limited to, argon. In another instance, the gas 109 may include, but is not limited to, krypton gas. In another instance, the gas 109 may include, but is not limited to, a mixture of argon gas with an additional gas.

It is further noted that the present disclosure may be extended to a number of gases. For example, gases suitable for implementation in plasma lamp 100 may include, but are not limited, to Xe, Ar, Ne, Kr, He, $N_2$, $H_2O$, $O_2$, $H_2$, $D_2$, $F_2$, $CH_4$, one or more metal halides, a halogen, Hg, Cd, Zn, Sn, Ga, Fe, Li, Na, Ar:Xe, ArHg, KrHg, XeHg, and the like. In a general sense, the present disclosure should be interpreted to extend to any light pumped plasma generating system and should further be interpreted to extend to any type of gas suitable for sustaining a plasma within a plasma lamp.

In another embodiment, the generated or maintained plasma 107 emits broadband radiation 120. In one embodiment, the broadband illumination 120 emitted by the plasma 107 includes extreme ultraviolet (EUV) radiation. In one embodiment, the broadband illumination 120 emitted by the plasma 107 includes vacuum ultraviolet (VUV) radiation. In another embodiment, the broadband illumination 120 emitted by the plasma 107 includes deep ultraviolet (DUV) radiation. In another embodiment, the broadband illumination 120 emitted by the plasma 107 includes ultraviolet (UV) radiation. In another embodiment, the broadband illumination 120 emitted by the plasma 107 includes visible radiation.

For example, the plasma 107 may emit short-wavelength radiation in the range of 120 to 200 nm. By way of another example, the plasma 107 may emit short-wavelength radiation having a wavelength below 120 nm. In another embodiment, the plasma 107 may emit radiation having a wavelength larger than 200 nm.

In the case where the plasma 107 is sustained within the cavity section 102 and/or the nozzle assembly 104, the cavity section 102 and/or the nozzle assembly 104 may be formed from any material known in the art that is at least partially transparent to radiation generated by plasma 107. In one embodiment, the cavity section 102 and/or the nozzle assembly 104 may be formed from any material known in the art that is at least partially transparent to VUV radiation. In another embodiment, the cavity section 102 and/or the nozzle assembly 104 may be formed from any material known in the art that is at least partially transparent to DUV radiation. In another embodiment, the cavity section 102 and/or the nozzle assembly 104 may be formed from any material known in the art that is transparent to UV radiation. In another embodiment, the cavity section 102 and/or the nozzle assembly 104 may be formed from any material known in the art transparent to visible light.

In another embodiment, the cavity section 102 and/or the nozzle assembly 104 may be formed from any material known in the art transparent to radiation 120 (e.g., visible or IR radiation) from a pump source (e.g., pump source 202).

In another embodiment, the cavity section 102 and/or the nozzle assembly 104 may be formed from any material known in the art transparent to both radiation from a pump source and radiation (e.g., EUV radiation, VUV radiation, DUV radiation, UV radiation and visible radiation) emitted by the plasma 107.

In some embodiments, the cavity section 102 and/or the nozzle assembly 104 may be formed from a low-OH content fused silica glass material. In other embodiments, the cavity section 102 and/or the nozzle assembly 104 may be formed from high-OH content fused silica glass material. For example, the transmission element 108 (or bulb) may include, but is not limited to, SUPRASIL 1, SUPRASIL 2, SUPRASIL 300, SUPRASIL 310, HERALUX PLUS, HERALUX-VUV, and the like. In other embodiments, the cavity section 102 and/or the nozzle assembly 104 may include, but is not limited to, calcium fluoride ($CaF_2$), magnesium fluoride ($MgF_2$), crystalline quartz and sapphire. It is noted herein that materials such as, but not limited to, $CaF_2$, $MgF_2$, crystalline quartz and sapphire provide transparency to short-wavelength radiation (e.g., $\lambda<190$ nm). Various glasses suitable for implementation in the cavity section 102 and/or the nozzle assembly 104 of the present disclosure are discussed in detail in A. Schreiber et al., *Radiation Resistance of Quartz Glass for VUV Discharge Lamps*, J. Phys. D:

Appl. Phys. 38 (2005), 3242-3250, which is incorporated herein by reference in the entirety.

Figure 2:
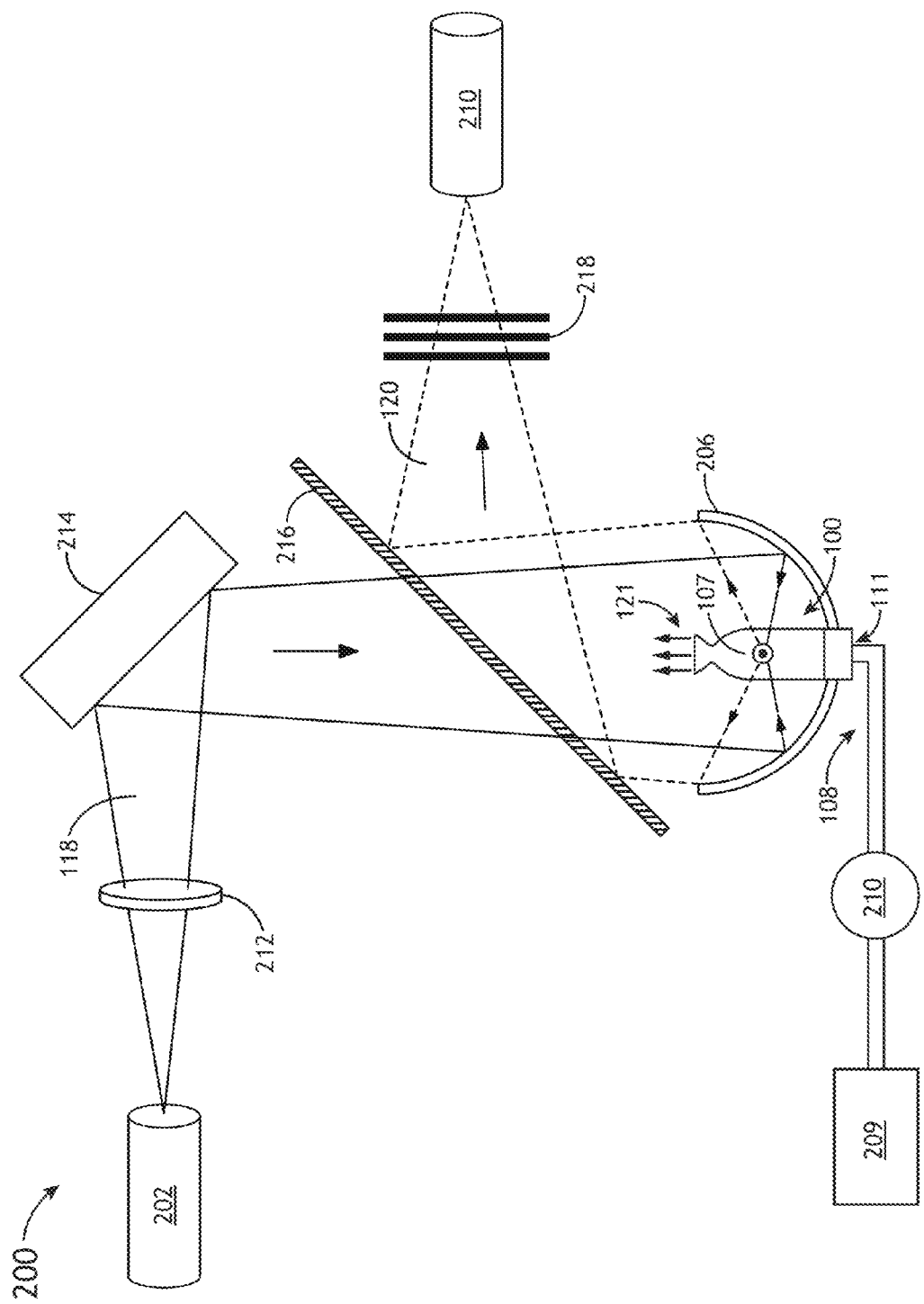
FIG. 2 is a high level schematic view of a system for generating light-sustained plasma with the open plasma lamp, in accordance with one embodiment of the present disclosure.

FIG. 2 illustrates a system 200 for generating broadband radiation with a plasma sustained in an open plasma lamp, in accordance with one embodiment of the present disclosure. In one embodiment, the system 200 includes the plasma lamp 100 for generating, or maintaining, a plasma 107. It is noted herein that the embodiments and examples provided previously herein with respect to the plasma lamp 100 should be interpreted to extend to system 200.

In another embodiment, the system 200 includes a pump source 202 (e.g., one or more lasers) configured to generate illumination of a selected wavelength, or wavelength range, such as, but not limited to, infrared or visible radiation.

In one embodiment, the plasma lamp 100 is configured to receive illumination from the pump source 202 in order to generate a plasma 107 within a plasma generation region of the volume of gas 109 located within the plasma lamp 100 or proximate to an output of the plasma lamp 100 (see FIGS. 1C-1F). As previously noted, in the case where plasma 107 is sustained within the cavity section 102 and/or the nozzle assembly 104, the cavity section 102 and/or the nozzle assembly 104 are at least partially transparent to the illumination generated by the pump source 202, allowing illumination delivered by the pump source 202 (e.g., delivered via fiber optic coupling or delivered via free space coupling) to be transmitted through the cavity section 102 and/or the nozzle assembly 104 into the plasma lamp 100. In another embodiment, upon absorbing illumination from source 202, the plasma 107 emits broadband radiation (e.g., broadband IR, broadband visible, broadband UV, broadband DUV, broadband VUV and/or broadband EUV radiation). As previously noted, the cavity section 102 and/or the nozzle assembly 104 may be at least partially transparent to at least a portion of the broadband radiation emitted by the plasma 107.

In another embodiment, the gas supply assembly 108 includes a gas supply 209. For example, the gas supply may include, but is not limited to, a stored volume of the gas 109 used for forming plasma 107. In another embodiment, the gas supply assembly 108 includes at least one of a pump, a blower, or a fan configured to control the flow of gas 109 from the supply 209 to the gas port 111. In another embodiment, after the gas 109 has been exhausted from plasma lamp 100 it may be vented to ambient surroundings. It is noted herein that this configuration is not a limitation on the present disclosure. For example, the output of plasma lamp 100 may be coupled to a gas recirculation sub-system, as described in more detail further herein.

In another embodiment, the system 200 includes a collector/reflector element 206 configured to focus illumination emanating from the pump source 202 into the volume of gas contained within the plasma lamp 100 or from a region proximate to the output of the plasma lamp 100. The collector element 206 may take on any physical configuration known in the art suitable for focusing illumination emanating from the pump source 202. In one embodiment, as shown in FIG. 2, the collector element 206 may include a concave region with a reflective internal surface suitable for receiving illumination 118 from the pump source 202 and focusing the illumination 118 to the gas 109 within the plasma lamp 100 or to the gas 109 in a region proximate to the output of the plasma lamp 100. For example, the collector element 206 may include an ellipsoid-shaped collector element 206 having a reflective internal surface, as shown in FIG. 2. By way of another example, the system 200 may be adapted to operate with a parabolic collector element 206 having a reflective internal surface (not shown).

In another embodiment, the collector element 206 is arranged to collect broadband illumination 120 (e.g., EUV radiation, VUV radiation, DUV radiation, UV radiation and/or visible radiation) emitted by plasma 107 and direct the broadband illumination to one or more additional optical elements (e.g., homogenizer 210, filter and the like). For example, the collector element 206 may collect at least one of EUV broadband radiation, VUV broadband radiation, DUV radiation, UV radiation or visible radiation emitted by plasma 107 and direct the broadband illumination 120 to one or more downstream optical elements. In this regard, the plasma lamp 100 may deliver EUV radiation, VUV radiation, DUV radiation, UV radiation and/or visible radiation to downstream optical elements of any optical characterization system known in the art, such as, but not limited to, an inspection tool or a metrology tool. It is noted herein the plasma lamp 100 of system 200 may emit useful radiation in a variety of spectral ranges including, but not limited to, EUV radiation, DUV radiation, VUV radiation, UV radiation, and visible radiation.

In one embodiment, system 200 may include various additional optical elements. In one embodiment, the set of additional optics may include collection optics configured to collect broadband light emanating from the plasma 107. For instance, the system 200 may include a spectral selection mirror 216, such as dichroic mirror (e.g., hot mirror, cold mirror), arranged to transmit pump illumination 118 from the pump source 202 and direct broadband illumination from the collector element 206 to downstream optics, such as, but not limited to, a homogenizer 120.

In another embodiment, the set of optics may include one or more lenses (e.g., lens 212) placed along either the illumination pathway or the collection pathway of system 200. The one or more lenses may be utilized to focus illumination from the pump source 202 into the volume of gas 109. Alternatively, the one or more additional lenses may be utilized to focus broadband light emanating from the plasma 107 onto a selected target (not shown).

In another embodiment, the set of optics may include a turning mirror 214. In one embodiment, the turning mirror 214 may be arranged to receive illumination 118 from the pump source 202 and direct the illumination to the volume of gas via collection element 206. In another embodiment, the collection element 206 is arranged to receive illumination from mirror 214 and focus the illumination to the focal point of the collection element 206 (e.g., ellipsoid-shaped collection element), where the plasma lamp 100 is located.

In another embodiment, the set of optics may include one or more filters (not shown) placed along either the illumination pathway or the collection pathway in order to filter illumination prior to light entering the plasma lamp 100 or to filter illumination following emission of the light from the plasma 107. It is noted herein that the set of optics of system 200 as described above and illustrated in FIG. 2 are provided merely for illustration and should not be interpreted as limiting. It is anticipated that a number of equivalent or additional optical configurations may be utilized within the scope of the present disclosure.

In another embodiment, the pump source 202 of system 200 may include one or more lasers. The pump source 202 may include any laser system known in the art. For instance, the pump source 202 may include any laser system known in the art capable of emitting radiation in the infrared, visible or ultraviolet portions of the electromagnetic spectrum. In one embodiment, the pump source 202 may include a laser system configured to emit continuous wave (CW) laser radiation. For example, the pump source 202 may include one or more CW infrared laser sources. For example, in settings where the gas flowed through the plasma lamp 100 is or includes argon, the pump source 202 may include a CW laser (e.g., fiber laser or disc Yb laser) configured to emit radiation at 1069 nm. It is noted that this wavelength fits to a 1068 nm absorption line in argon and as such is particularly useful for pumping argon gas. It is noted herein that the above description of a CW laser is not limiting and any laser known in the art may be implemented in the context of the present disclosure.

In another embodiment, the pump source 202 may include one or more diode lasers. For example, the pump source 202 may include one or more diode lasers emitting radiation at a wavelength corresponding with any one or more absorption lines of the species of the gas 109. A diode laser of the pump source 202 may be selected for implementation such that the wavelength of the diode laser is tuned to any absorption line of any plasma (e.g., ionic transition line) or any absorption line of the plasma-producing gas (e.g., highly excited neutral transition line) known in the art. As such, the choice of a given diode laser (or set of diode lasers) will depend on the type of gas 109 used in plasma lamp 100 of system 200.

In another embodiment, the pump source 202 may include an ion laser. For example, the pump source 202 may include any noble gas ion laser known in the art. For instance, in the case of an argon-based plasma, the pump source 202 used to pump argon ions may include an Ar+ laser.

In another embodiment, the pump source 202 may include one or more frequency converted laser systems. For example, the pump source 202 may include a Nd:YAG or Nd:YLF laser having a power level exceeding 100 watts. In another embodiment, the pump source 202 may include a broadband laser. In another embodiment, the illumination source may include a laser system configured to emit modulated laser radiation or pulsed laser radiation.

In another embodiment, the pump source 202 may include one or more lasers configured to provide laser light at substantially a constant power to the plasma 107. In another embodiment, the pump source 202 may include one or more modulated lasers configured to provide modulated laser light to the plasma 107. In another embodiment, the pump source 202 may include one or more pulsed lasers configured to provide pulsed laser light to the plasma 107.

In another embodiment, the pump source 202 may include one or more non-laser sources. In a general sense, the pump source 202 may include any non-laser light source known in the art. For instance, the pump source 202 may include any non-laser system known in the art capable of emitting radiation discretely or continuously in the infrared, visible or ultraviolet portions of the electromagnetic spectrum.

In another embodiment, the pump source 202 may include two or more light sources. In one embodiment, the pump source 202 may include or more lasers. For example, the pump source 202 (or illumination sources) may include multiple diode lasers. By way of another example, the pump source 202 may include multiple CW lasers. In a further embodiment, each of the two or more lasers may emit laser radiation tuned to a different absorption line of the gas or plasma of the plasma lamp 100.

Figure 3A:
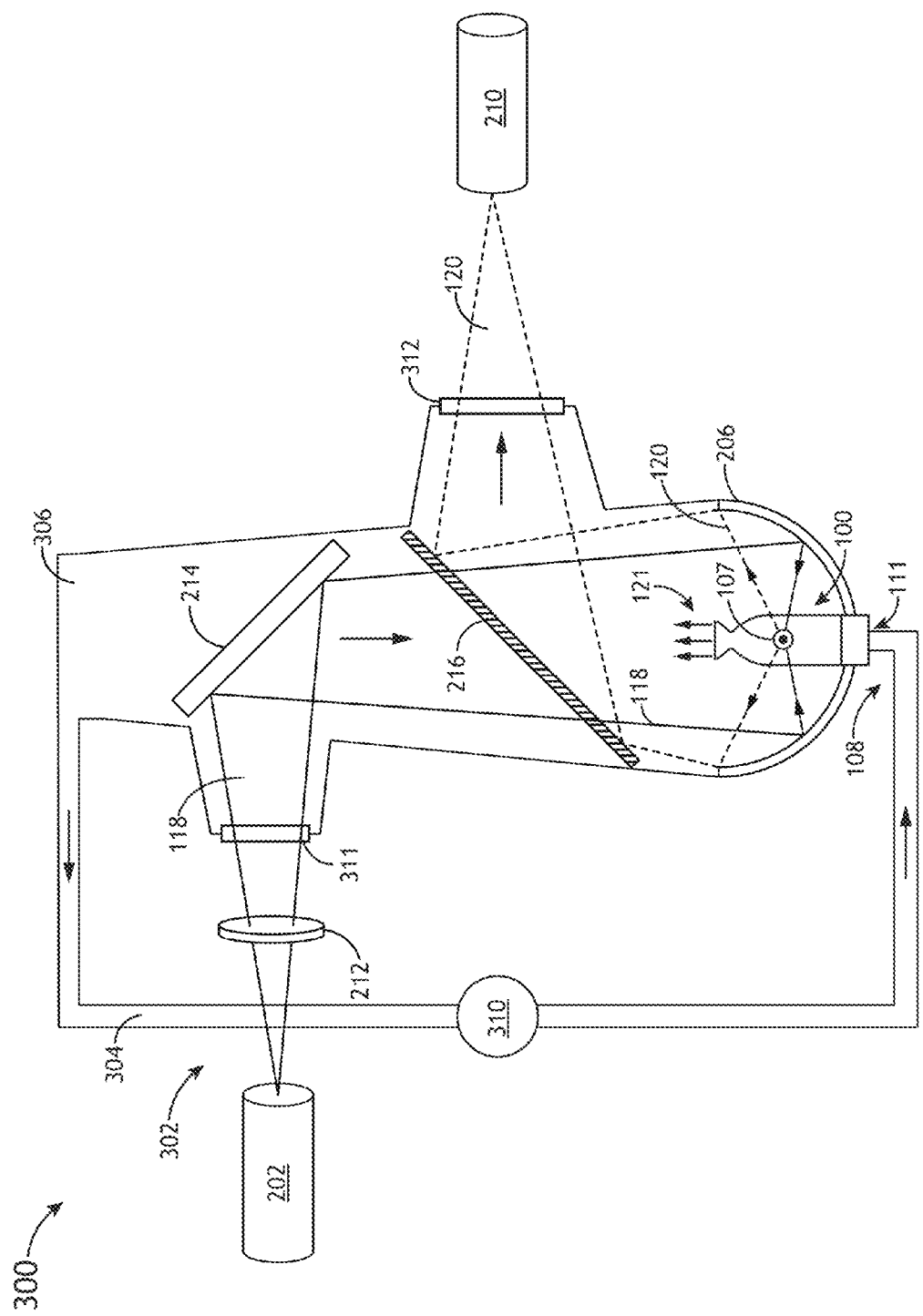
FIG. 3A is a high level schematic view of a system for generating light-sustained plasma equipped with a recirculation sub-system, in accordance with one embodiment of the present disclosure.
Figure 3B:
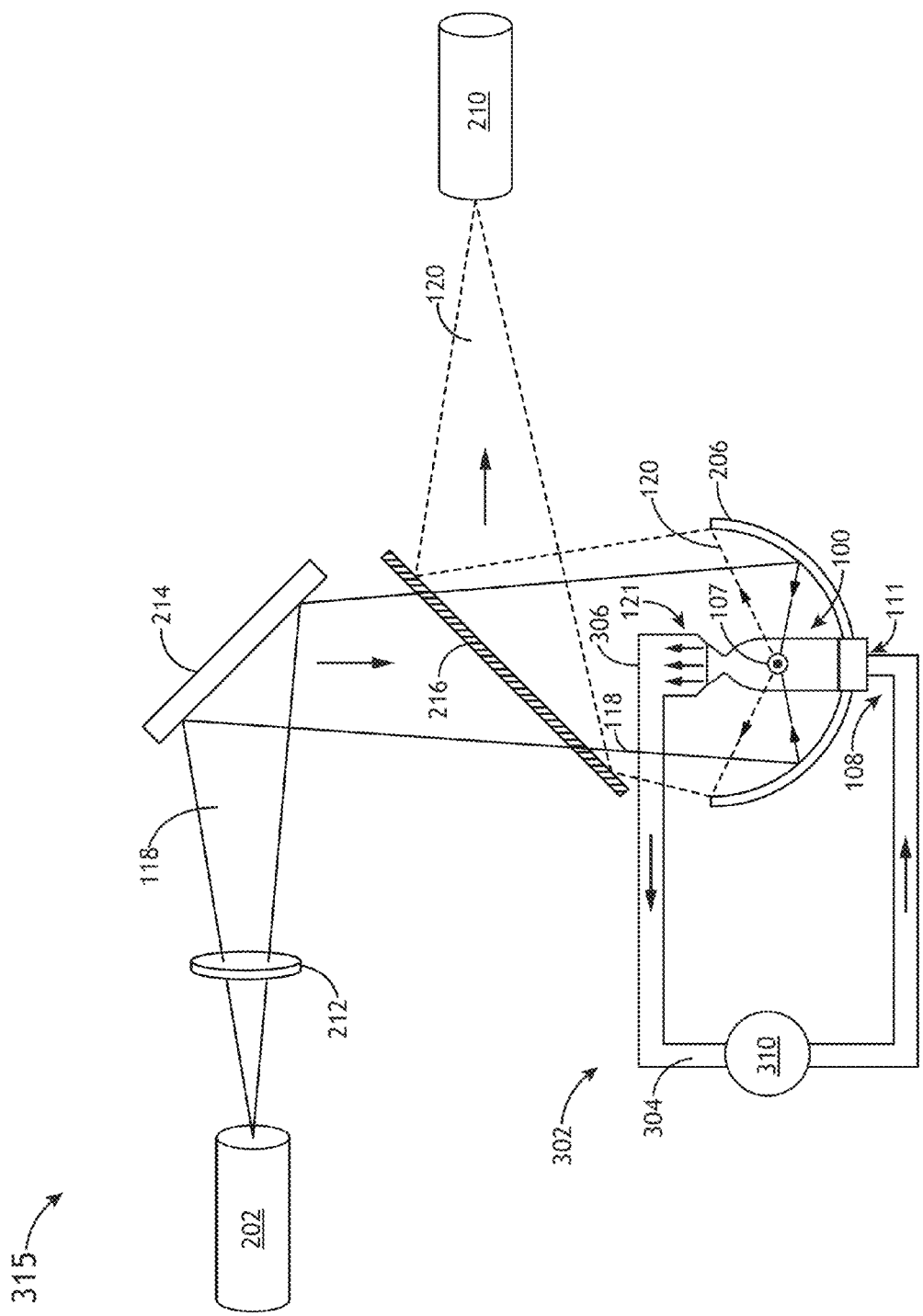
FIG. 3B is a high level schematic view of a system for generating light-sustained plasma equipped with a recirculation sub-system, in accordance with one embodiment of the present disclosure.

FIGS. 3A-3B illustrate a system 300 for generating broadband radiation equipped with a gas recirculation sub-system, in accordance with one embodiment of the present disclosure.

It is noted herein that the embodiments and examples provided previously herein with respect to FIGS. 1A-2 should be interpreted to extend to the system 300. The implementation of a recirculation sub-system is described in detail in U.S. patent application Ser. No. 14/224,945, filed on Mar. 24, 2014, which is incorporated above by reference in the entirety.

In one embodiment, the system 300 includes a gas recirculation sub-system 302. The gas recirculation sub-system 302 may uptake gas exhausted from the plasma lamp 100 and recirculate it such that it may be reused in the plasma sustaining process described throughout the present disclosure (after sufficient cooling of the gas).

In one embodiment, the system 300 includes a gas containment structure 306 suitable for containing gas as it is exhausted from plasma lamp 100. In another embodiment, the recirculation sub-system 302 includes a return line 304 configured to transfer hot gas from the top portion of the gas containment structure 306 to the gas port 111 of the plasma lamp 100 for re-use by the plasma lamp 100.

In another embodiment, the gas recirculation sub-system 302 includes one or more gas pumps 310 for facilitating circulation of gas 109 through the recirculation sub-system 302 and controlling the pressure and/or mass flow rate of the gas flowing through the plasma lamp 100. It is noted herein that, in place of a gas pump, the recirculation sub-system may utilize one or more gas blowers or gas fans to control the flow of gas through the recirculation sub-system 302.

In another embodiment, the system 300 includes one or more windows 311 coupled to the gas containment structure 306 and arranged to allow incident illumination 118 from the pump source 202 to enter the volume of the gas containment structure 306 and the concave region 109 of the collector element 206. The window 311 may include any window material known in the art suitable for transmitting light, such as laser light, from the illumination source 202 to the inside of the containment structure 306. In another embodiment, the system 300 includes one or more windows 312 coupled to the gas containment structure 306 and arranged to allow emitted broadband radiation 120 from the plasma lamp 100 and collector element 206 to be transmitted to downstream optical elements, such as, but not limited to, homogenizer 210. The window 312 may include any window material known in the art suitable for transmitting light, such as broadband light (e.g., EUV, VUV, DUV, UV and/or visible), from the inside of the containment structure 306 to a location outside of the containment structure 306.

In another embodiment, although not shown, the collector 206 of system 300 may be inverted. For example, the collector element 206 may be, but is not required to be, located at a position above the plasma lamp 100. In this embodiment, the collector 206 may include an exhaust opening allowing gas, after it leaves the plasma lamp 100, to pass through the wall of the collector 206 and into the recirculation system 300. An inverted collector integrated with a recirculation sub-system is described in detail in U.S. patent application Ser. No. 14/224,945, filed Mar. 25, 2014, which is incorporated above by reference in the entirety.

In another embodiment, as shown in FIG. 3B, the gas containment structure 306 may be localized to the output of the nozzle assembly 104 of the plasma lamp 100. In this embodiment, it is not necessary to pressurize the entire optical system associated with system 300, making the handling and operation of system 300 more manageable. It is recognized herein that the recirculation sub-system 306 of system 300 is not limited to the configurations depicted in FIGS. 3A-3B, which are provided merely for illustrative purposes.

Figure 4:
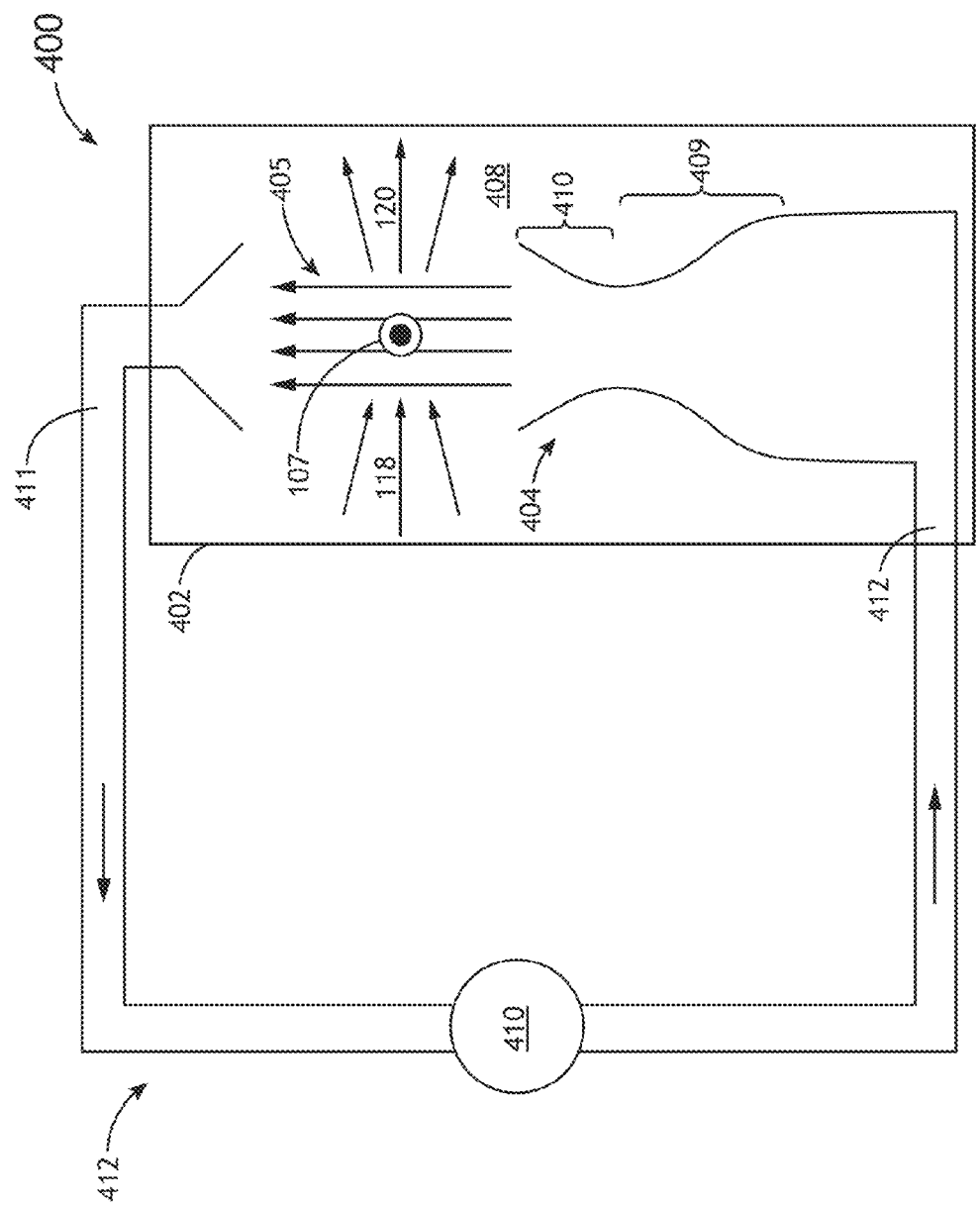
FIG. 4 is a schematic view of a flow controlled plasma lamp, in accordance with one embodiment of the present disclosure.

FIG. 4 illustrates a system 400 for delivering a gas flow to a plasma 107, in accordance with one or more embodiments of the present disclosure. In one embodiment, the system 400 includes a plasma lamp 402 (e.g., plasma cell or plasma bulb) suitable for producing light-sustained plasma broadband light 120. For purposes of clarity, the pump source and various other optical elements have not been depicted in FIG. 4. It is noted herein that the various embodiments and examples described previously herein with respect to FIGS. 1A-3B should be interpreted to extend to system 400 of FIG. 4.

In one embodiment, the system 400 includes a gas recirculation sub-system 412, which includes a gas uptake line 411 and a gas return line 412. In another embodiment, the plasma lamp 402 contains a nozzle assembly 404 suitable for establishing a laminar flow 405 at the plasma generation region of the plasma lamp 402. It is noted herein that the use of laminar gas flow through the plasma generation region provides improved stability and allows for shaping of light emitting region of the gas 408. It is further noted that the providing flow to the plasma 107 serves to increase broadband output as a higher plasma temperature can be achieved, as noted previously herein.

In one embodiment, the nozzle assembly 404 includes any combination of converging and diverging nozzle sections known in the art. For example, as shown in FIG. 4, the nozzle assembly 404 may include, but is not limited to, a converging section 409 and/or a diverging nozzle section 410. Such a configuration has been described previously herein and that description should be interpreted to extend to system 400. It is further noted that such a converging-diverging nozzle configuration is suitable for establishing a laminar flow 405 in gas 404, as shown in FIG. 4.

In another embodiment, the recirculation of gas by the recirculation sub-system 412 may either be active or passive. For example, as shown in FIG. 4, the sub-system 412 may include, but is not limited to, a gas pump 410 (or a gas blower or gas fan). By way of another example, the recirculation sub-system 412 may circulate gas through the uptake and return lines 411, 412 via natural convection.

FIGS. 5A-5F illustrate a series of convection control devices suitable for implementation in a plasma lamp, in accordance with one or more embodiments of the present disclosure.

In one embodiment, a plasma lamp 500 includes a gas containment structure 501 configured to contain a gas 504 suitable for generating a plasma 107 upon absorption of pump illumination 118 from a pump source (e.g., pump source 202 of FIG. 2). For example, the plasma lamp 500 may include, but is not limited to, a plasma bulb or plasma cell. In this regard, the gas containment structure 501 may include the transparent portion of a plasma bulb or plasma cell. It is noted herein that the convection control devices in the following examples may be utilized in the context of any light-sustained plasma generation scenario and are not limited to the plasma lamps and/or cells described previously herein.

Various devices and methods for convection control are described in U.S. patent application Ser. No. 12/787,827, filed on May 26, 2010; U.S. patent application Ser. No. 14/231,196, filed on Mar. 31, 2014; U.S. patent application Ser. No. 13/647,680, filed on Oct. 9, 2012; U.S. patent application Ser. No. 14/224,945, filed on Mar. 25, 2014; U.S. patent application Ser. No. 14/567,546, filed Dec. 11, 2014; and U.S. patent application Ser. No. 14/288,092, filed May 27, 2014, which are each incorporated by reference above in the entirety.

Figure 5A:
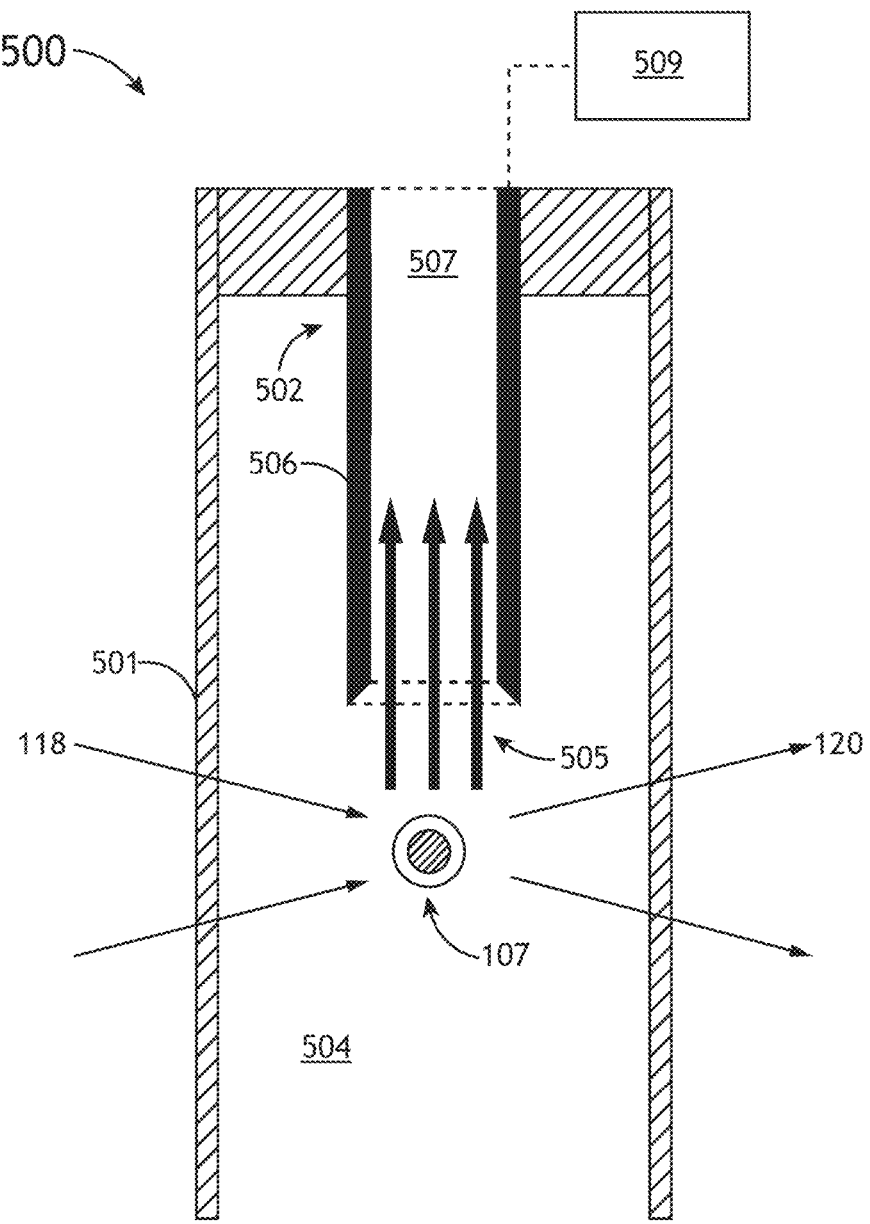
FIGS. 5A-5F are schematic views of plasma lamps equipped with convection control elements, in accordance with one embodiment of the present disclosure.

In another embodiment, the plasma lamp 500 includes a convection control 502 element disposed within the gas containment structure 501. In one embodiment, the convection control element 506 includes a channel 507 for directing a plume 505 of the plasma 107 along a selected direction. For example, as shown in FIG. 5A, the plume 505 of plasma 107 is directed upward by the hollow structure of the convection control element 506. It is noted that the channel 507 serves to eliminate, or at least reduce, direct contact between the plume 505 and the internal walls of the gas containment structure 501. Reducing the direct contact between the plume 505 and the internal walls of the gas containment structure 501 aids in reducing thermal stress on the gas containment structure 501.

In another embodiment, the convection control element is thermally coupled to a thermal reservoir 509. In this regard, the convection control element 506 may transfer heat from the plume 505 of the plasma 107 to the thermal reservoir 509 located outside of the plasma lamp 500. In one embodiment, as shown in FIG. 5A, the channel 507 is closed at the top portion of the convection control element.

Figure 5B:
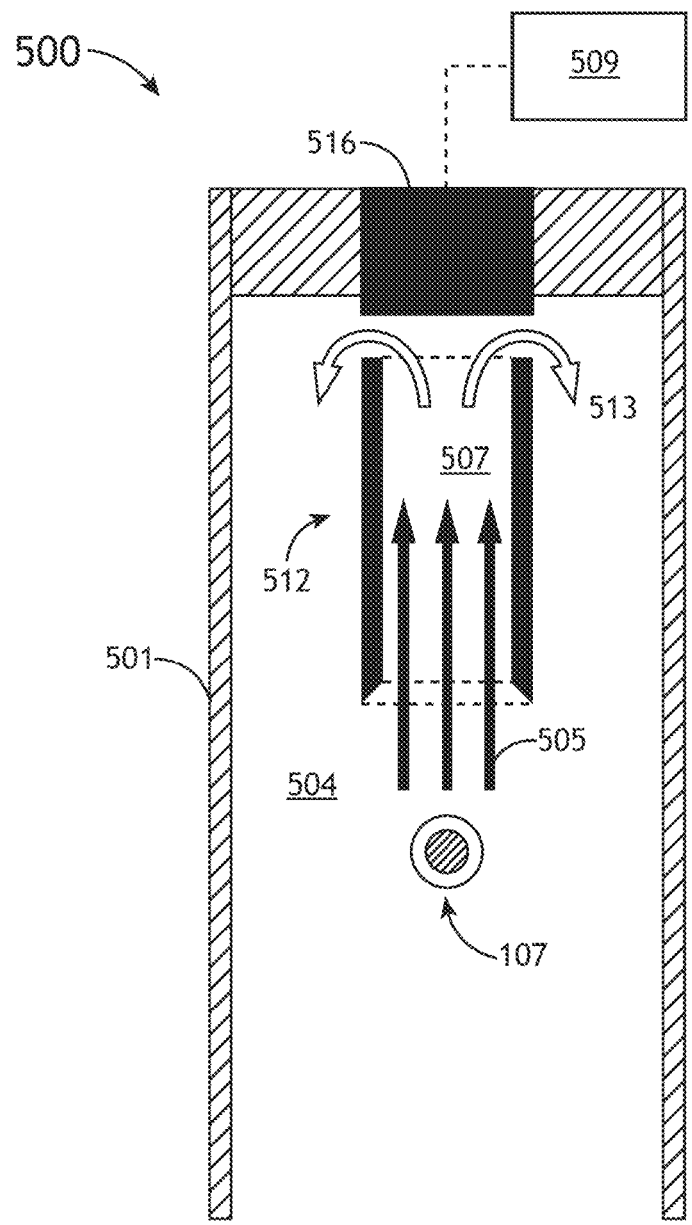

In another embodiment, as shown in FIG. 5B, the channel 507 for directing a plume 505 of the plasma 107 is open at a top portion of the convection control element 512. In one embodiment, the convection control element 512 may return gas 513 from a top portion of the convection control element 512 to a plasma generation region located below the convection control element 512. For example, as heat is transferred from the hot gas to heat exchange element 516, the gas cools and is circulated back to a region below the convection control element 512 through a return channel 518. For example, as shown in FIG. 5B, the return channel 518 may be defined by the convection control element 512 and the inside wall of the gas containment structure 501. Then, the gas may be re-used in the sustaining of plasma 107.

Figure 5C:
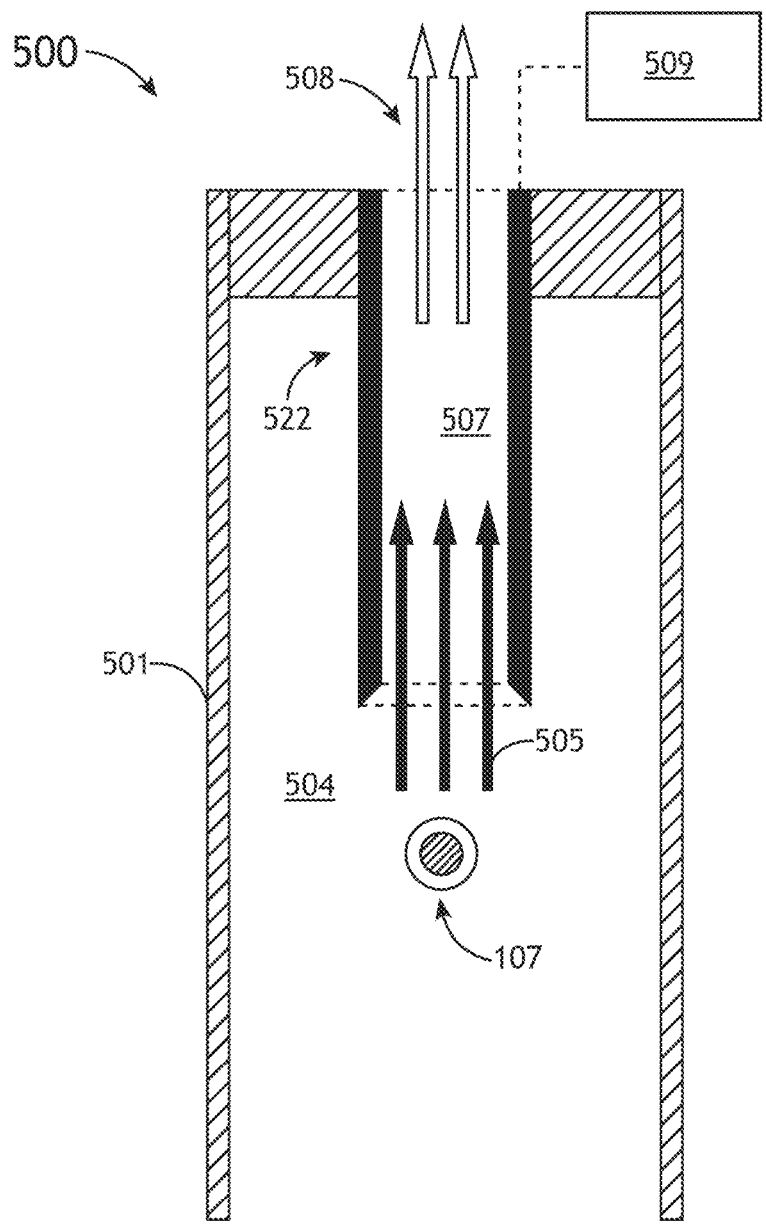

In another embodiment, as shown in FIG. 5C, the open-ended convection control element 522 transfer gas to a region external to the plasma lamp 100. In this regard, the open-ended convection control element 522 may act to vent hot gas to a region outside of the plasma lamp 100.

Figure 5D:
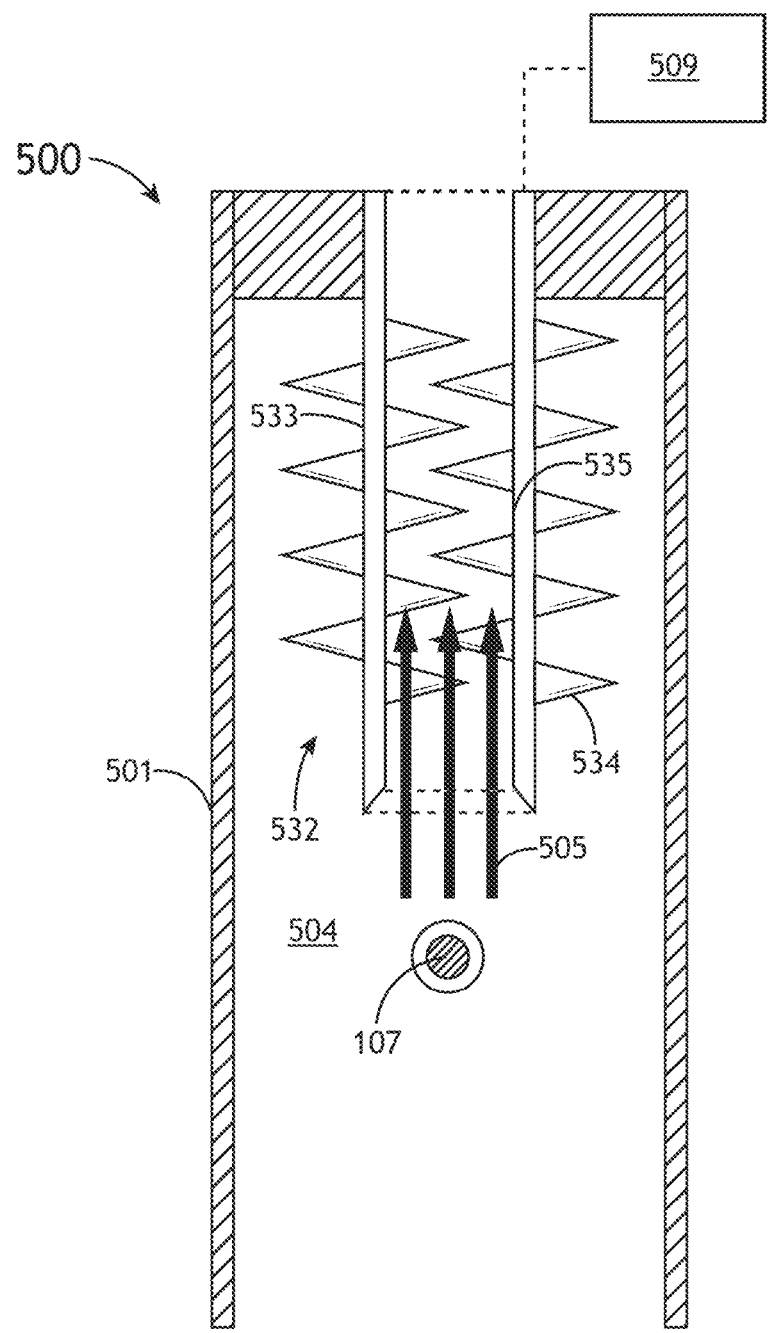

In another embodiment, as shown in FIG. 5D, one or more heat exchange structures 534 are disposed on one or more surfaces 533, 535 of the convection control element 532. In one embodiment, the one or more heat exchange structures 534 are configured to transfer heat from the plume 505 of the plasma 107 to the convection control element 532. In another embodiment, the convection control element 532 is also thermally coupled to the thermal reservoir 509. In this regard, heat is transferred from the plume 505 of the plasma 107 to the thermal reservoir 509 via the heat exchange structures 534. The heat exchange structures 534 may include any heat exchange structure known in the art. For example, as shown in FIG. 5D, the heat exchange structures 534 include, but are not limited to, a set of heat exchange fins.

Figure 5E:
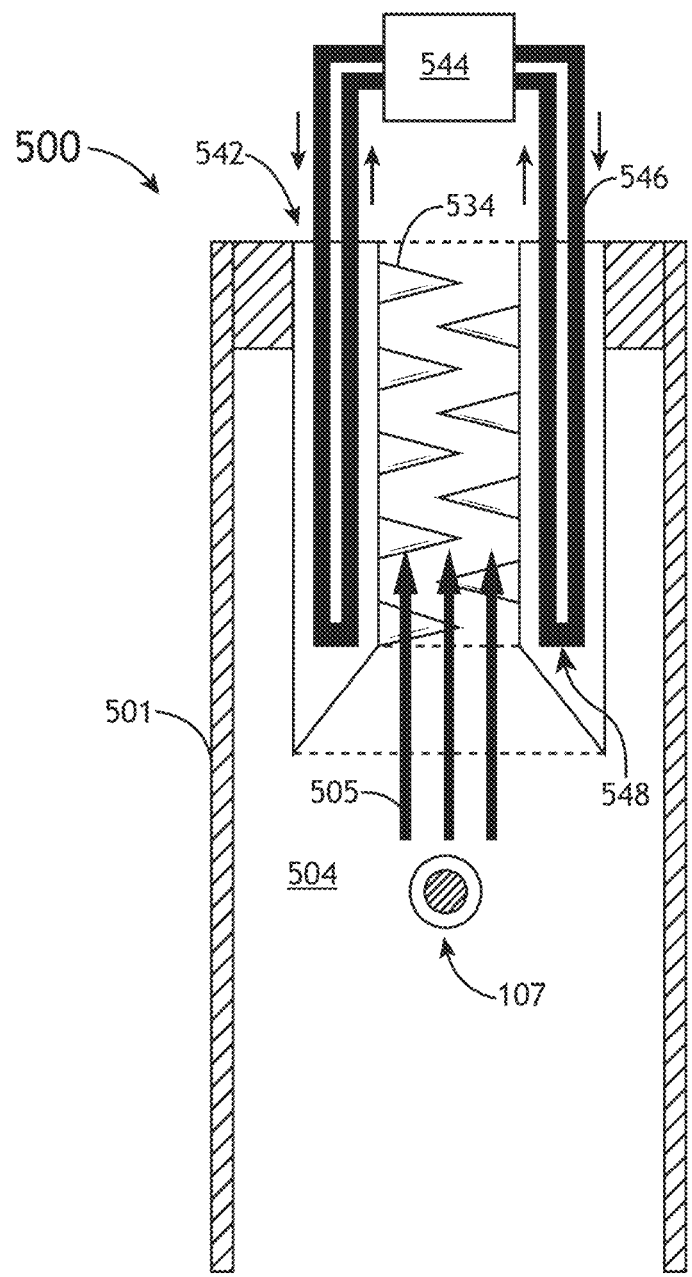

In another embodiment, as shown in FIG. 5E, the plasma lamp 500 includes a coolant sub-system 544. In one embodiment, the coolant sub-system 544 includes one or more coolant loops 546. In another embodiment, a portion of the one or more coolant loops 546 are disposed within one or more channels 548 formed within the convection control element 542. In another embodiment, the one or more coolant loops 546 transfer heat from the convection control element 542 to a fluid coolant circulated in the one or more coolant loops 546. It is noted herein that the coolant sub-system 544 and coolant loops 546 are not limited to the case where heat exchange elements are implemented. It is noted that that coolant sub-system 544 and the coolant loops 546 may be implemented within any of the settings described in the present disclosure.

In another embodiment, the coolant sub-system 544 may include any number of components used in the art of fluid-based cooling. For example, the coolant sub-system 544 may include one or more pumps used to pump a fluid coolant through the coolant loops 546. In another embodiment, the coolant sub-system 544 may include a heat exchanger (not shown) suitable for transfer heat from coolant loops 546 to an additional coolant loop (not shown) or any other heat sink.

Figure 5F:
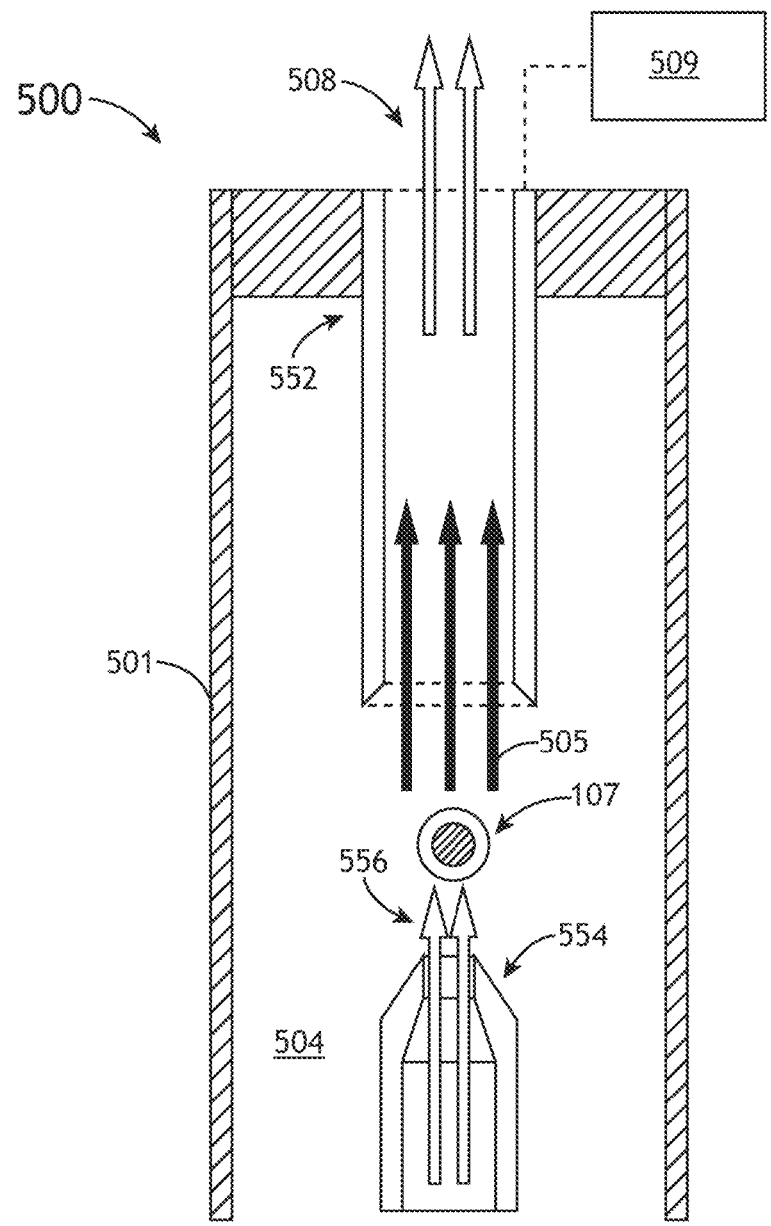

In another embodiment, as shown in FIG. 5F, the plasma lamp 500 include a second convection control element 554. In one embodiment, the first convection control element 552 is located in the top portion of the plasma lamp 500, with the second convection element 554 located in the bottom portion of the plasma lamp 500, as depicted in FIG. 5F.

In one embodiment, the bottom convection element 554 is configured for shaping gas flow 556 through the plasma generation region. For example, the bottom convection element 554 may be configured to form a jet, a laminar gas flow, a super-sonic gas flow and the like. For instance, the convection element 554 may include, but is not limited to, a converging-diverging nozzle assembly. For example, the convection element 554 may include, but is not limited to, a de Laval nozzle. It is noted that the various nozzle assemblies described previously herein may be extended to the embodiment depicted in FIG. 5F.

In another embodiment, the convection elements of FIGS. 5A-5F may operate as one or more electrodes of the plasma lamp 500. For example, any one of the convection elements 502, 512, 522, 532, 542, 552 and/or 554 may serve as electrodes of the plasma lamp used to ignite the plasma 107 prior to laser pumping. It is further noted that if used for plasma ignition the various convection elements may also include a protruding needle structure (e.g., see FIGS. 6A-6B) to facilitate gas breakdown during plasma ignition.

It is noted herein that the present disclosure is not limited to the structural elements and arrangements depicted in FIGS. 5A-5F, which are provided merely for illustrative purposes. It is recognized herein that a variety of structural elements and/or arrangements may be used within the scope of the present disclosure.

Figure 6A:
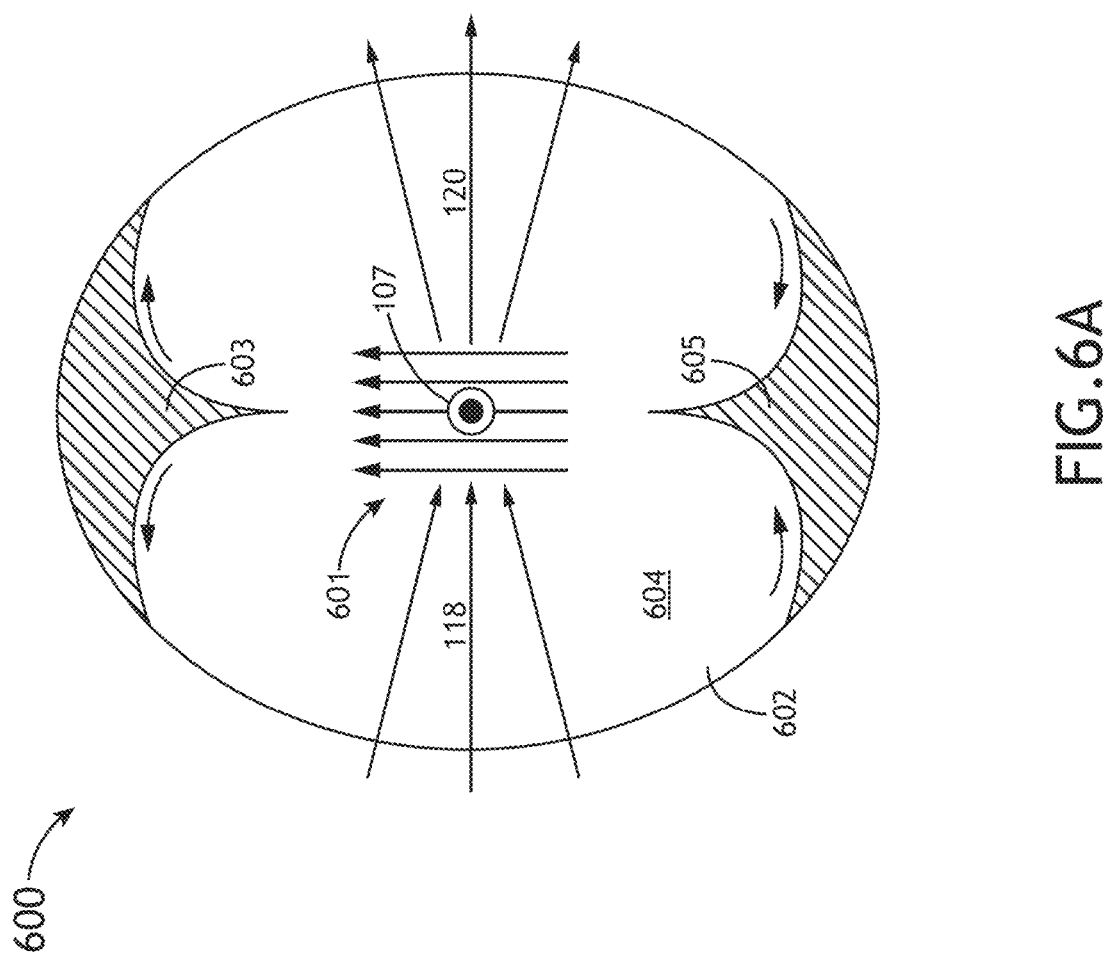

FIGS. 6A-6B illustrate a plasma lamp 600 equipped with one or more convection control structures suitable for establishing laminar flow via natural convection, in accordance with one or more embodiments of the present disclosure.

In one embodiment, as shown in FIG. 6A, the plasma lamp 600 may take the form of a plasma bulb 602. In one embodiment, the bulb 602 may include a set of convection elements 603, 605 suitable for establishing laminar flow 601 across the generating region of the plasma with natural convection. It is noted that the structures 603, 605 depicted in FIG. 6A serve to reduce turbulence within the bulb 602. For example, as hot gas travels upward from the plasma 107, the structures direct the gas outward, while also extracting heat from the gas. As the gas transfers heat to the top structure 603, the gas cools and is replaced by hotter upwardly moving and circulating gas. This configuration tends to produce the gas motion as conceptually depicted by the arrows in FIG. 6A. It is noted that these arrows represent an idealization of gas flow within the bulb 602, but serve to highlight the tendency of the structures 603, 605 to reduce turbulence and establish laminar flow through natural convection. In another embodiment, as shown in FIG. 6B, the plasma lamp 600 may take the form of a plasma cell 602. It is noted that the structures 603, 605 of plasma cell 602 are analogous to the structures of FIG. 6A. As such, the description of FIG. 6A should be interpreted to extend to FIG. 6B.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An open plasma lamp for forming a light-sustained plasma comprising:
   a cavity section including a gas input and a gas output; and
   a nozzle assembly fluidically coupled to the gas output of the cavity section, wherein the nozzle assembly and cavity section are arranged such that a volume of a gas receives pumping illumination from a pump source to sustain a plasma within the gas, wherein the sustained plasma emits broadband radiation, wherein the nozzle assembly is configured to establish a gas flow from within the cavity section to a region external to the cavity section such that a portion of the sustained plasma is removed from the cavity section by the gas flow.

2. The plasma lamp of claim 1, wherein the nozzle assembly includes a converging section.

3. The plasma lamp of claim 1, wherein the nozzle assembly includes a converging section.

4. The plasma lamp of claim 1, wherein the nozzle assembly is a converging-diverging nozzle assembly.

5. The plasma lamp of claim 4, wherein the converging-diverging nozzle assembly is a de Laval nozzle assembly.

6. The plasma lamp of claim 1, wherein one or more sections of the nozzle assembly have a geometrical shape including at least one of a cylinder, a truncated prolate spheroid, a truncated oblate spheroid, a truncated spheroid or a truncated ellipsoid.

7. The plasma lamp of claim 1, wherein the cavity section has a geometrical shape including at least one of a cylinder, a spheroid, a prolate spheroid, an oblate spheroid or a truncated ellipsoid.

8. The plasma lamp of claim 1, wherein at least a portion of the cavity section is transparent to at least a portion of the pumping illumination and the broadband radiation emitted by the plasma.

9. The plasma lamp of claim 1, wherein at least a portion of the nozzle assembly is transparent to at least a portion of the pumping illumination and the broadband radiation emitted by the plasma.

10. The plasma lamp of claim 1, wherein at least a portion of the nozzle assembly is opaque to at least one of the pumping illumination or the broadband radiation emitted by the plasma.

11. The plasma lamp of claim 1, wherein the nozzle assembly is formed from a first material and the cavity section is formed from a second material different from the first material.

12. The plasma lamp of claim 11, wherein the nozzle assembly is reversibly mechanically couplable to the cavity section.

13. The plasma lamp of claim 1, wherein the nozzle assembly and the cavity section are formed from the same material.

14. The plasma lamp of claim 13, wherein the cavity section and the nozzle assembly form an integrated structure.

15. The plasma lamp of claim 1, wherein the nozzle assembly is configured to control at least one characteristic of the flow of plasma within the plasma lamp.

16. The plasma lamp of claim 15, wherein the nozzle assembly is configured to control the pressure of the gas.

17. The plasma lamp of claim 15, wherein the nozzle assembly is configured to control the mass flow rate of the gas.

18. The plasma lamp of claim 1, wherein the nozzle assembly is configured to establish a sub-sonic flow rate of the gas.

19. The plasma lamp of claim 1, wherein the nozzle assembly is configured to establish a super-sonic flow rate of the gas.

20. The plasma lamp of claim 1, wherein the nozzle assembly is configured to establish a Laminar flow of the gas.

21. The plasma lamp of claim 1, wherein the gas flow established by the nozzle assembly is suitable for removing an outer layer of the plasma.

22. The plasma lamp of claim 1, further comprising: a gas supply assembly, the gas supply assembly including a gas supply and one or more of at least one of a blower, a pump or a fan configured to control a gas flow rate in the internal volume of at least one of the cavity section or the nozzle assembly.

23. The plasma lamp of claim 1, wherein the cavity section and nozzle assembly are configured to sustain the plasma at a location within the cavity section.

24. The plasma lamp of claim 1, wherein the cavity section and nozzle assembly are configured to sustain the plasma at a location within the nozzle assembly.

25. The plasma lamp of claim 1, wherein the cavity section and nozzle assembly are configured to sustain the plasma at a location external to the nozzle assembly.

26. The plasma lamp of claim 1, wherein a transparent portion of at least one of the nozzle assembly or the cavity section is formed from at least one of calcium fluoride, magnesium fluoride, lithium fluoride, crystalline quartz, sapphire or fused silica.

27. The plasma lamp of claim 1, wherein the gas comprises:
at least one of an inert gas, a non-inert gas or a mixture of two or more gases.

28. A system for forming a light-sustained plasma comprising:
a pump source configured to generate pumping illumination;
an open plasma lamp comprising:
a cavity section; and
a nozzle assembly fluidically coupled to the cavity section,
wherein the nozzle assembly is configured to establish a gas flow from within the cavity section to a region external to the cavity section such that a portion of the sustained plasma is removed from the cavity section by the gas flow; and
a reflector element arranged to focus the illumination from the pump source into the gas in order to sustain a plasma within the gas, wherein the plasma emits broadband radiation.

29. The system of claim 28, wherein the nozzle assembly includes a converging section.

30. The system of claim 28, wherein the nozzle assembly includes a converging section.

31. The system of claim 28, wherein the nozzle assembly is a converging-diverging nozzle assembly.

32. The system of claim 31, wherein the converging-diverging nozzle assembly is a de Laval nozzle assembly.

33. The system of claim 28, wherein at least a portion of the cavity section is transparent to at least a portion of the pumping illumination and the broadband radiation emitted by the plasma.

34. The system of claim 28, wherein at least a portion of the nozzle assembly is transparent to at least a portion of the pumping illumination and the broadband radiation emitted by the plasma.

35. The system of claim 28, wherein at least a portion of the nozzle assembly is opaque to at least one of the pumping illumination or the broadband radiation emitted by the plasma.

36. The system of claim 28, wherein the nozzle assembly is formed from a first material and the cavity section is formed from a second material different from the first material.

37. The system of claim 36, wherein the nozzle assembly is reversibly mechanically couplable to the cavity section.

38. The system of claim 28, wherein the nozzle assembly and the cavity section are formed from the same material.

39. The system of claim 38, wherein the cavity section and the nozzle assembly form an integrated structure.

40. The system of claim 28, wherein the nozzle assembly is configured to control at least one characteristic of the flow of plasma within the plasma lamp.

41. The system of claim 40, wherein the nozzle assembly is configured to control the pressure of the gas.

42. The system of claim 40, wherein the nozzle assembly is configured to control the mass flow rate of the gas.

43. The system of claim 28, wherein the nozzle assembly is configured to establish a sub-sonic flow rate of the gas.

44. The system of claim 28, wherein the nozzle assembly is configured to establish a super-sonic flow rate of the gas.

45. The system of claim 28, wherein the nozzle assembly is configured to establish a Laminar flow of the gas.

46. The system of claim 28, wherein the gas flow established by the nozzle assembly is suitable for removing an outer layer of the plasma.

47. The system of claim 28, further comprising: a gas supply assembly, the gas supply assembly including a gas supply and one or more of at least one of a blower, a pump or a fan configured to control a gas flow rate in the internal volume of at least one of the cavity section or the nozzle assembly.

48. The system of claim 28, wherein the reflector element is arranged to focus the illumination from the pump source into the gas a location within the cavity section in order to sustain a plasma within the gas.

49. The system of claim 28, wherein the reflector element is arranged to focus the illumination from the pump source into the gas a location within the nozzle assembly in order to sustain a plasma within the gas.

50. The system of claim 28, wherein the reflector element is arranged to focus the illumination from the pump source into the gas a location external to the nozzle assembly in order to sustain a plasma within the gas.

51. The system of claim 28, wherein a transparent portion of at least one of the nozzle assembly or the cavity section is formed from at least one of calcium fluoride, magnesium fluoride, lithium fluoride, crystalline quartz, sapphire or fused silica.

52. The system of claim 28, wherein the gas comprises:
at least one of an inert gas, a non-inert gas or a mixture of two or more gases.

53. The system of claim 28, wherein the pump source comprises:
one or more lasers.

54. The system cell of claim 53, wherein the one or more lasers comprise:
one or more infrared lasers.

55. The system of claim 53, wherein the one or more lasers comprise:
at least one of a diode laser, a continuous wave laser, or a broadband laser.

56. The system of claim 53, wherein the one or more pump lasers comprise:
one or more lasers configured to provide laser light at substantially a constant power to the plasma.

57. The system of claim 53, wherein the one or more pump lasers comprise:
one or more modulated lasers configured to provide modulated laser light to the plasma.

58. The system of claim 28, wherein the broadband radiation emitted by the plasma includes at least one of extreme ultraviolet radiation, vacuum ultraviolet radiation, deep ultraviolet radiation, ultraviolet radiation or visible radiation.

59. The system of claim 28, wherein the reflector element is arranged to collect at least a portion of the broadband radiation emitted by the sustained plasma and direct the broadband radiation to one or more additional optical elements.

60. The system of claim 28, wherein the reflector element comprises:
at least one of an ellipsoid-shaped collector element or a parabolic collector element.

61. The system of claim 28, further comprising:
a gas containment structure.

62. The system of claim 61, further comprising:
a gas recirculation sub-system.

63. A plasma lamp for forming a light-sustained plasma comprising:
a gas containment structure configured to contain a gas suitable for generating a plasma upon absorption of pump illumination from a pump source; and
a convection control element disposed within the gas containment structure, wherein the convection control element includes a channel for directing a plume of the plasma along a selected direction.

64. The plasma lamp of claim 63, wherein the gas containment structure comprises:
at least one of a plasma bulb or a plasma cell.

65. The plasma lamp of claim 63, wherein the channel for directing a plume of the plasma is closed at a top portion of the convection control element.

66. The plasma lamp of claim 63, wherein the channel for directing a plume of the plasma is open at a top portion of the convection control element, wherein the convection control element is configured to return gas from a top portion of the convection control element to a plasma generation region.

67. The plasma lamp of claim 63, wherein the channel for directing a plume of the plasma is open at a top portion of the convection control element, wherein the convection control element is configured to transfer gas to a region external to the plasma lamp.

68. The plasma lamp of claim 63, further comprising:
one or more heat exchange structures disposed on at least one surface of the convection control element.

69. The plasma lamp of claim 63,
a coolant sub-system including one or more coolant loops, wherein a portion of the one or more coolant loops are disposed within channels formed within the convection control element, wherein the one or more coolant loops are configured to transfer heat from the convection control element to a fluid coolant circulated in the one or more coolant loops.

70. The plasma lamp of claim 63, wherein the convection control element is an electrode of the plasma lamp configured to initiate the plasma.

* * * * *